(12) United States Patent
Kohtz et al.

(10) Patent No.: US 9,088,281 B2
(45) Date of Patent: Jul. 21, 2015

(54) TRIGGER DEVICE FOR MOBILE COMPUTING DEVICE

(71) Applicant: Intermec IP Corp., Fort Mill, SC (US)

(72) Inventors: Robert A. Kohtz, Cedar Rapids, IA (US); Rickey Austin, Lisbon, IA (US); Joseph Cook, Coralville, IA (US)

(73) Assignee: Intermec IP Corp., Fort Mill, SC (US)

( * ) Notice: Subject to any disclaimer, the term of this patent is extended or adjusted under 35 U.S.C. 154(b) by 312 days.

(21) Appl. No.: 13/791,756

(22) Filed: Mar. 8, 2013

(65) Prior Publication Data

US 2014/0049120 A1 Feb. 20, 2014

Related U.S. Application Data

(60) Provisional application No. 61/691,142, filed on Aug. 20, 2012.

(51) Int. Cl.
| | |
|---|---|
| *G06K 7/10* | (2006.01) |
| *H03K 17/94* | (2006.01) |
| *G06F 3/0362* | (2013.01) |
| *G06F 3/01* | (2006.01) |
| *G06F 3/0346* | (2013.01) |
| *G06F 3/0338* | (2013.01) |
| *G05G 9/047* | (2006.01) |
| *G05G 1/02* | (2006.01) |

(52) U.S. Cl.
CPC ............... *H03K 17/94* (2013.01); *G05G 9/047* (2013.01); *G06F 3/016* (2013.01); *G06F 3/0338* (2013.01); *G06F 3/0346* (2013.01); *G06F 3/0362* (2013.01); *G05G 1/02* (2013.01); *Y10T 307/773* (2015.04)

(58) Field of Classification Search
USPC ............ 235/472.01, 472.02, 472.03, 462.45, 235/462.48
IPC ......... G06K 7/10881,7/10851, 7/10772, 17/002
See application file for complete search history.

(56) References Cited

U.S. PATENT DOCUMENTS

| | | | | |
|---|---|---|---|---|
| 5,349,497 | A | * | 9/1994 | Hanson et al. ........... 361/679.58 |
| 5,679,943 | A | | 10/1997 | Schultz et al. |
| 5,736,726 | A | * | 4/1998 | VanHorn et al. ......... 235/472.02 |
| 2008/0068198 | A1 | * | 3/2008 | Chen ........................ 340/686.6 |
| 2012/0088483 | A1 | * | 4/2012 | Liao ............................ 455/418 |
| 2014/0014728 | A1 | * | 1/2014 | Choi et al. ................... 235/470 |
| 2014/0105591 | A1 | * | 4/2014 | Van Norman ................ 396/544 |

* cited by examiner

*Primary Examiner* — Karl D Frech
(74) *Attorney, Agent, or Firm* — Additon, Higgins & Pendleton, P.A.

(57) ABSTRACT

A mobile computing device includes a processor and a trigger device operatively attached to the mobile computing device and configured to generate a mechanical vibration pattern for selectively actuating the mobile computing device. A trigger interface, illustratively an accelerometer, is configured to convert the mechanical vibration pattern into an electrical signal pattern. The processor is configured to actuate a mobile computing function depending on the mechanical vibration pattern generated by the trigger device. A table of properties stored in memory correlates the mechanical vibration generated by the trigger device with a specific mobile computing function. The trigger device may include a plurality of trigger parts; and the mechanical vibration pattern generated by the trigger device may include multiple bits of data generated by the plurality of trigger parts. The mobile computing device may be in a candy bar, clam shell, or other form factor and may include a removable handle.

20 Claims, 25 Drawing Sheets

| Switch 1512 | Switch 1514 | Switch 1516 |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

| Mechanical Vibration Pattern (MVP) | Tonal Electrical Pattern (TEP) | Specific Computing Function (SCF) | |
|---|---|---|---|
| MVP1 | TEP1 | Scan function | ~1402 |
| MVP2 | TEP2 | RFID function | ~1404 |
| MVP3 | TEP3 | Low battery | ~1406 |
| MVP4 ... MVP$_n$ | TEP4 ... TEP$_n$ | SCF4 ... SCF$_n$ | ~1408 |

| Trigger Device Mechanical Vibration Pattern Modulation | | | Trigger Interface Generated Electrical Signal Pattern (e.g. Tonal Modulation) | | | Computing Functionality Triggered In Mobile Computing Device |
|---|---|---|---|---|---|---|
| Switch 1512 | Switch 1514 | Switch 1516 | | | | |
| 0 | 0 | 0 | 0 | 0 | 0 | No function |
| 0 | 0 | 1 | 0 | 0 | 1 | Scan only |
| 0 | 1 | 0 | 0 | 1 | 0 | RFID only |
| 0 | 1 | 1 | 0 | 1 | 1 | WIFI only |
| 1 | 0 | 0 | 1 | 0 | 0 | WAN only |
| 1 | 0 | 1 | 1 | 0 | 1 | Scan + WIFI |
| 1 | 1 | 0 | 1 | 1 | 0 | Scan + WIFI + WAN |
| 1 | 1 | 1 | 1 | 1 | 1 | RFID + WIFI |

| Trigger Device Mechanical Vibration Pattern Modulation | | Trigger Interface Generated Electrical Signal Pattern (e.g. Tonal Modulation) | | Computing Functionality Triggered In Mobile Computing Device |
|---|---|---|---|---|
| 0 | 0 | 1 | 1 | No function |
| 0 | 1 | 1 | 0 | Scan |
| 1 | 0 | 0 | 1 | Battery check |
| 1 | 1 | 0 | 0 | Scan + Battery check |

FIG. 20C

TRIGGER DEVICE FOR MOBILE COMPUTING DEVICE

TECHNICAL FIELD

The present disclosure relates to mobile computing devices and more particularly to a trigger device for mobile computing applications.

BACKGROUND

High demand exists for mobile computing devices that can be used anywhere, anytime. One set of limitations placed on this demand is the quality, efficiency, reliability, safety, ergonomics, and cost effectiveness of the trigger.

A trigger may be a lever or button pushed by the finger or by some other external mechanism to activate a function. However, a trigger is not limited to a finger or other external activation. More broadly speaking, a trigger may also be located internally to the mobile computing device such as a circuit that initiates the action of another component. Hence, triggers may be external triggers or internal triggers depending on the design.

Triggers play an important role in the use of a mobile computing device. These conventional mobile computing devices include a handheld terminal, a lap top computer, a smart phone, a handheld personal digital assistant (PDA), a wireless mobile phone, a pager, an industrial grade mobile computer with scanning and/or RFID functionality, or any other mobile computing device. The mobile computing device may also include one or more radios configured for transmitting, receiving blue tooth, WiFi, or other communications.

In the consumer mobile computing industry, conventional mobile computing devices typically employ some form of a physical contact trigger, a touch screen button, or a voice interface for the external trigger used to activate a computing function. Many mobile computing devices are provided with an accelerometer configured to detect the orientation of the device as well as device movements and vibrations. These external triggers are additional to the internal triggers that are designed into the mobile computing device.

The set of design limitations of quality, efficiency, reliability, safety, ergonomics, and cost effectiveness have given general mobile computing devices many form factors. Most prevalent of these is the candy bar and the clam shell.

In the industrial mobile computing technology space, there is often a need for a more ruggedized form factor. For that reason, conventional industrial grade mobile computing devices typically employ some form of more ruggedized external trigger, such as a pull lever, to activate a computing function, Examples of industrial handheld mobile computing devices that use a lever for a trigger are the handheld scanner or the RFID scanner. These levers are often configured to activate the scanning or RFID function, respectively, when the lever is pulled. An example of a configuration of a trigger in a mobile computing device with a scanner is illustrated in FIG. 1. Such devices have widespread applications including capturing product and purchase price information at a point of sale for payment of the product by a customer.

The scanner of FIG. 1 also shows a form factor popularized in the industrial computing industry and deriving from the set of design limitations of quality, efficiency, reliability, safety, ergonomics, and cost effectiveness—namely, an industrial mobile computing device with a handle. As shown in FIG. 1, an illustrative prior art scanning device 10 includes a mobile computing terminal 15 and a handle 30. The mobile computing terminal 15 includes a scanner 20 which generates a beam of light that is reflected off a bar code (not shown) back into the scanner 20. The handle 30 includes a trigger 58 connected to a pivot 55 having a pivot arm 56. When mechanical trigger 58 is depressed, it pivots around pivot 55 causing pivot arm 56 to contact a head 51 of a switch 57 which closes a circuit (not shown) to generate a signal (not shown) for activation of the scanner. The switch head 54 and switch 57 illustratively provide a trigger interface 50, that is, an interface that converts the mechanical action of the trigger 58 into an electrical signal. Conventional trigger interface 50 is either a contact switch as shown in FIG. 1 or an electro-magnetic circuit where a circuit energizes an electromagnetic coil that induces a secondary coil of a secondary circuit to activate the scanner. See, for example, U.S. Pat. No. 5,349,497 held by the Assignee of this disclosure.

In these and other conventional mobile computing devices, there is a need for improved quality, efficiency, reliability, safety, ergonomics, and cost effectiveness to meet the high demand for mobile computing devices that can be used anywhere anytime. This disclosure addresses that need.

SUMMARY OF THE INVENTION

A mobile computing device is disclosed. The mobile computing device includes a first processor. A trigger device operatively attached to the mobile computing device is configured to generate a mechanical vibration pattern for selectively actuating the mobile computing device. A trigger interface is configured to detect and convert the mechanical vibration pattern into an electrical signal pattern. The first processor is configured to actuate a mobile computing function depending on the mechanical vibration pattern generated by the trigger device. In an illustrative example, the frequencies of the mechanical vibrations are in the sub-sonic to ultrasonic range.

In an illustrative embodiment, the trigger interface may include an accelerometer device. Illustratively, the conversion of the mechanical vibration pattern may include decoding the mechanical vibration pattern into mechanical vibration components. The trigger interface may further include a second processor configured to provide this function of decoding the mechanical vibration patterns into mechanical vibration components.

A memory in the mobile computing device may be configured to store a table of properties correlating the electrical signal pattern generated by the trigger interface with a specific mobile computing function. The specific mobile computing function may include a first set of specific mobile computing functions taken from the group consisting of a scanner function and an RFID function. The specific computing function may include a second set of specific mobile computing functions taken from mechanical vibration patterns generated by other than the trigger device such as vibrations from tapping a touch screen.

The mobile computing device of this disclosure may be in the form factor of a candy bar, a clam shell, or any other form factor. In an illustrative industrial mobile computing device application, the mobile computing device includes a terminal device part, and a handle part connected to the terminal device part; with the trigger device connected to the handle part of the terminal device. In another embodiment, the handle part is removable.

In another embodiment, the terminal device part includes a case and the handle part includes a case; and the vibration pattern generated by the trigger device travels along the case of the handle part to the case of the terminal device part.

In another embodiment, the mobile computing device includes a display unit configured to display a message based on the tonal modulation generated by the trigger interface.

In another embodiment, the trigger interface further includes a piezoelectric device configured to provide the tonal modulation.

In another embodiment, decoding of the mechanical vibration pattern may be done by amplitude and level analysis, frequency (spectral) analysis; noise and distortion analysis; pulse and transition analysis; time domain analysis, tone measurements. In another embodiment, the processing in the trigger interface may involve signal processing; digital filtering processing; convolution and correlation processing; frequency domain processing; joint time-frequency analysis signal processing; sampling/resampling processing; signal generation processing; spectral analysis processing; transform processing; time domain processing; and wavelet and filter bank processing.

In another embodiment, the trigger device of the mobile computing device includes a plurality of trigger parts; and the mechanical vibration pattern generated by the trigger device includes multiple bits of data generated by the plurality of trigger parts.

In an illustrative process according to this disclosure, a method of actuating a mobile computing functionality in a mobile computing device comprises the steps of: activating a trigger device operatively attached to a mobile computing device; generating a mechanical vibration pattern for selectively actuating the mobile computing device; detecting the mechanical vibration pattern; converting the mechanical vibration pattern into an electrical signal pattern; and actuating the mobile computing device depending on the mechanical vibration pattern generated by the trigger device.

Other embodiments are also disclosed.

BRIEF DESCRIPTION OF THE DRAWINGS

FIG. 20A shows an illustrative memory map of this disclosure configured to store a table of properties correlating the mechanical vibration pattern generated by the trigger device to a specific mobile computing function.

FIG. 20B shows an alternative memory map of this disclosure illustratively for use with the analog protocol used by the trigger device of FIG. 18.

FIG. 20C shows an alternative memory map of this disclosure illustratively for use with the analog protocol used by the trigger device of FIG. 19C.

DETAILED DESCRIPTION

Figure 1:
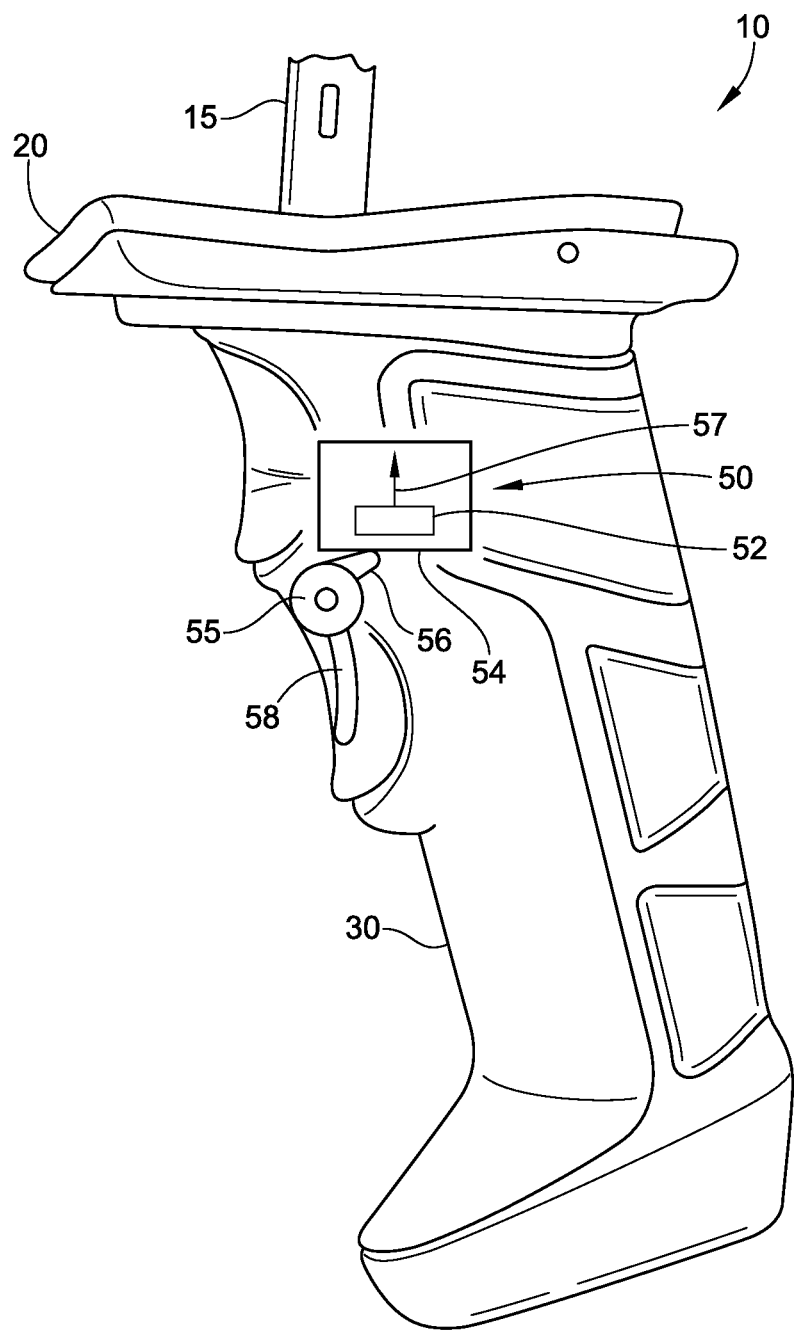
FIG. 1 shows a prior art mobile computing device with a scanner.

A mobile computing device is disclosed. The mobile computing device includes a first processor. A trigger device operatively attached to the mobile computing device is configured to generate a mechanical vibration pattern for selectively actuating the mobile computing device. A trigger interface is configured to detect and convert the mechanical vibration pattern into an electrical signal pattern. The first processor is configured to actuate a mobile computing function depending on the mechanical vibration pattern generated by the trigger device in response to the electrical signal pattern. In an illustrative example, the frequencies of the mechanical vibrations are in the sub-sonic to ultrasonic range.

In an illustrative embodiment, the trigger interface may include an accelerometer device. Illustratively, the conversion of the mechanical vibration pattern includes decoding the mechanical vibration pattern into mechanical vibration components.

In another embodiment, the trigger interface may further include a second processor configured to decode the mechanical vibration patterns into mechanical vibration components. A memory in the mobile computing device may be configured to store a table of properties correlating the mechanical vibration pattern generated by the trigger device with a specific mobile computing function.

In one embodiment, the memory may be configured to store a table of properties correlating an electrical signal pattern generated by the trigger interface from the mechanical vibration pattern with a first set of specific mobile computing functions. In an illustrative embodiment, the first set of specific mobile computing functions may be taken from the group consisting of a scanner function and an RFID function. In another embodiment the table of properties in the memory includes properties correlating electrical signal patterns generated by the trigger interface with a second set of specific mobile computing functions. In an illustrative embodiment, the second set of mobile computing functions may be electrical signal patterns taken from mechanical vibration patterns generated by other than the trigger device. In an illustrative embodiment, the mechanical vibration patterns generated by other than the trigger device include vibrations from tapping a touch screen.

In another embodiment, the mobile computing device includes a terminal device part; and a handle part connected to the terminal device part. In an illustrative embodiment the trigger device is connected to the handle part of the terminal device. In another embodiment, the handle part is removable.

In another embodiment, the terminal device part includes a case and the handle part includes a case; and the vibration pattern generated by the trigger device travels along the case of the handle part to the case of the terminal device part. In another embodiment, the trigger interface includes an accelerometer device included in the handle part of the mobile computing device, and a second processor included in the handle part of the mobile computing device configured to decode the mechanical vibration patterns into mechanical vibration components. Illustratively, the trigger interface may further include a memory configured to store a table of properties correlating the electrical signal pattern generated by the trigger interface from the mechanical vibration pattern with a first set of specific mobile computing functions.

In another illustrative example, the memory configured to store the table of properties is included in the handle part of the mobile computing device. In another example, the table of properties in the memory in the handle part of the mobile computing device includes properties correlating electrical signal patterns generated by the trigger interface with a first set of specific mobile computing functions. In yet another example, the first set of specific mobile computing functions is taken from the group consisting of a scanner function and an RFID function. In another example, the table of properties in the memory in the handle part of the mobile computing device includes properties correlating electrical signal patterns generated by the trigger interface with a second set of specific mobile computing functions. Illustratively, the second set of mobile computing functions may be electrical signal patterns taken from mechanical vibration patterns generated by other than the trigger device. As yet another example, the mechanical vibration patterns generated by other than the trigger device include vibrations from tapping a touch screen.

In another embodiment, the trigger interface further modulates the mechanical vibration pattern into tonal electrical patterns. The tonal modulation may be based on any of a number of properties such as a property of a battery. Illustratively, the battery on which the property of the tonal modulation may be based is included in the terminal part of the mobile computing device. Alternatively, the battery on which the property of the tonal modulation may be based may be included in the handle part of the mobile computing device. In another embodiment, the tonal modulation is based on a property of either a scanning function or an RFID function In an illustrative embodiment, the tonal modulation may be based on the number of activations of the trigger device. In another embodiment, the tonal modulation may be based on the speed of activation of the trigger device. In another embodiment, the trigger device includes a plurality of trigger parts and the tonal modulation is based on activation of one or more of the plurality of trigger parts.

In another embodiment, the mobile computing device includes a display unit configured to display a message based on the tonal modulation generated by the trigger interface.

In another embodiment, the trigger interface further includes a piezoelectric device configured to provide the tonal modulation.

In another embodiment, decoding may be done by amplitude and level analysis, frequency (spectral) analysis; noise and distortion analysis; pulse and transition analysis; time domain analysis, tone measurements. In another embodiment, the processing in the trigger interface may involve signal processing; digital filtering processing; convolution and correlation processing; frequency domain processing; joint time-frequency analysis signal processing; sampling/resampling processing; signal generation processing; spectral analysis processing; transform processing; time domain processing; or wavelet and filter bank processing.

In another embodiment, the trigger device of the mobile computing device includes a plurality of trigger parts; and the mechanical vibration pattern generated by the trigger device includes multiple bits of data generated by the plurality of trigger parts.

In an illustrative process according to this disclosure, a method of actuating a mobile computing functionality in a mobile computing device comprises the steps of: activating a trigger device operatively attached to a mobile computing device; generating a mechanical vibration pattern for selectively actuating the mobile computing device; detecting the mechanical vibration pattern; converting the mechanical vibration pattern into an electrical signal pattern; and actuating the mobile computing device depending on the mechanical vibration pattern generated by the trigger device.

The foregoing has described generally the disclosure. We now turn to elaborating features of this disclosure.

Figure 2:
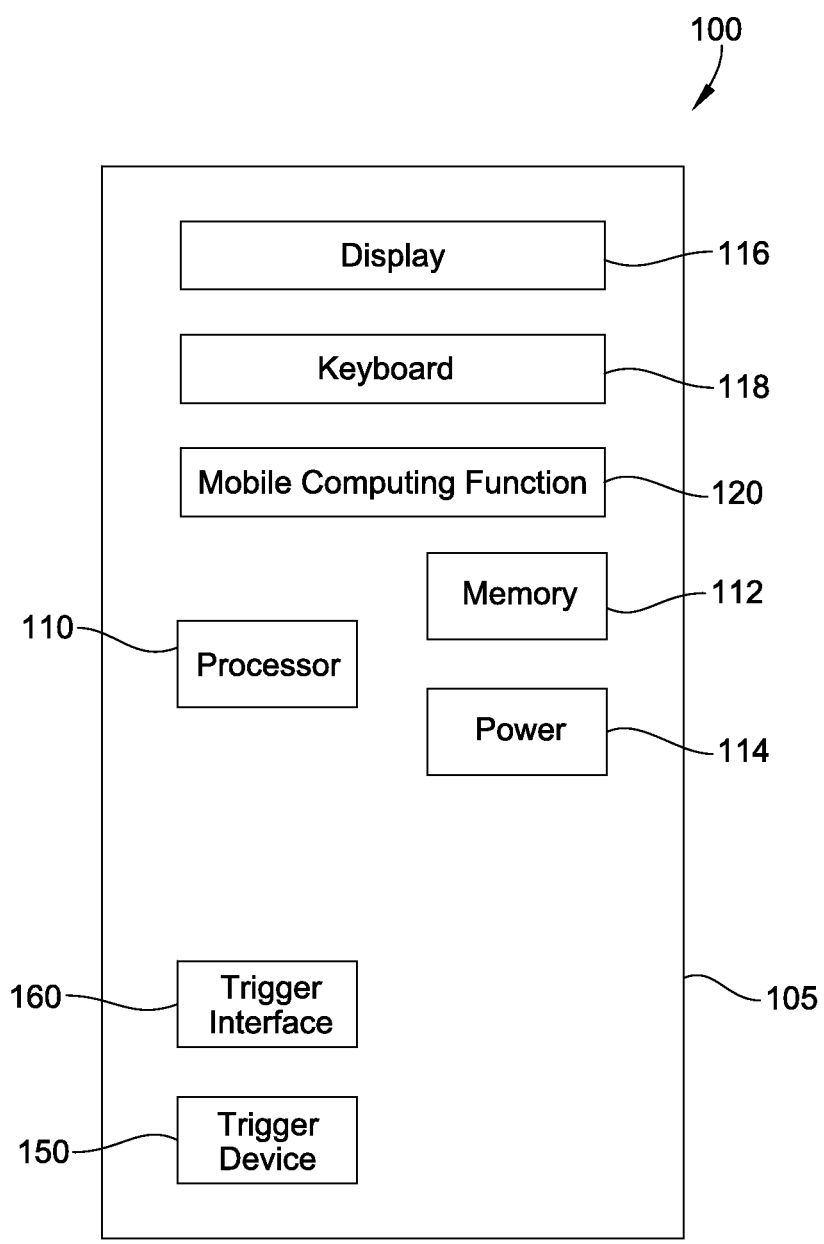
FIG. 2 shows an illustrative functional diagram of a mobile computing device of this disclosure.

FIG. 2 shows a functional diagram of a mobile computing device 100 of this disclosure. A mobile computing device 100 comprises: a first processor 110; a trigger device 150 operatively attached to the mobile computing device configured to generate a mechanical vibration pattern for selectively actuating the mobile computing device; and a trigger interface 160 configured to detect and convert the mechanical vibration pattern into an electrical signal pattern; wherein the first processor is configured to actuate a mobile computing function depending on the mechanical vibration pattern generated by the trigger device. The mobile computing device also comprises a memory unity 112, a power source 114, a display unit 116, a keyboard 118, and one or more computing functions 120.

Mobile computing device 100 can be a handheld terminal, a lap top computer, a smart phone, a handheld personal digital assistant (PDA), a wireless mobile phone, a pager, an industrial grade mobile computer with scanning and/or RFID functionality, or any other mobile computing device. The mobile computing device may also include one or more radios configured for transmitting, receiving blue tooth, WiFi, or other communications.

First processor 110 can be any microprocessor capable of accessing information stored in memory unit 112, performing actions based on instructions using information from memory unit 112 or some other source, and alternatively storing information in memory unit 112 or transmitting information. As described further below the processor is configured to actuate the mobile computing function 120 depending on the mechanical vibration pattern generated by the trigger device as described below.

Power source 114 can be a battery or fuel cell, a direct line from a wall outlet, current from a solar cell or any other power source sufficient to satisfy the power requirements for mobile computing device 100. Memory unit 112 can be any form of data storage. It may be at least one of random access memory (RAM) and/or read only memory (ROM). Information can be stored permanently until overwritten and/or stored temporarily for use while the unit is active.

Display unit 116, can include a visual display capable of displaying data transmitted from processing 110. Display unit 116 can include a LCD screen, e-paper, or other bi-stable display, a CRT display or any other type of visual display.

Keyboard 118 can be any data entry device for entering data into mobile computing device extended keyboard, keyboard wedge, QWERTY keyboard, a chiclet keyboard an enhanced Keyboard, an AT keyboard, a Dvorak keyboard, a virtual keyboard, an on-screen keyboard, a membrane keyboard, or any other data entry device for a mobile computing device.

One or more mobile computing functions 120 may be any one or more computing functionality provided by the mobile computing device. The one or more computing functions 120 may comprise a scan function, an RFID function, and other functions which may include one or more radios configured for transmitting, receiving blue tooth, Wifi, or other communications. Scan and RFID and other functions and hardware and software for implementing such functions in mobile computing device are well known in the art.

Still referring to FIG. 2, trigger device 150 operatively attached to the mobile computing device configured to generate a mechanical vibration pattern for selectively actuating the mobile computing device may illustratively comprise a movable trigger such as a lever or a button pushed, pulled, or touched by the finger or by some other external mechanism configured to generate a mechanical pattern for selectively actuating the mobile computing function. The lever may be in the form factor of a pivotable member such as shown in FIG. 1. The button may be in the form factor of a push-button as shown in the illustrative embodiments of FIGS. 13 and 14. Alternatively, the button may be in the form factor of a key of a keyboard, or a mouse. The trigger device may be any physical contact trigger configured to generate a mechanical pattern for selectively actuating the mobile computing function. They may include a tuning fork, a taut line, made for example, of wire, or a ratchet that may generate vibrations on physical contact. The trigger device may further include a touch screen device as further discussed below. Moreover, the trigger device of this disclosure is not limited to finger or other devices requiring external activation. More broadly speaking, the trigger of this device may also reside internally to the mobile computing device and include a circuit configured to generate a mechanical pattern for selectively actuating the mobile computing function. For example, the trigger device may be a piezoelectric crystal that generates a mechanical vibration on application of an electrical signal.

Figure 3:
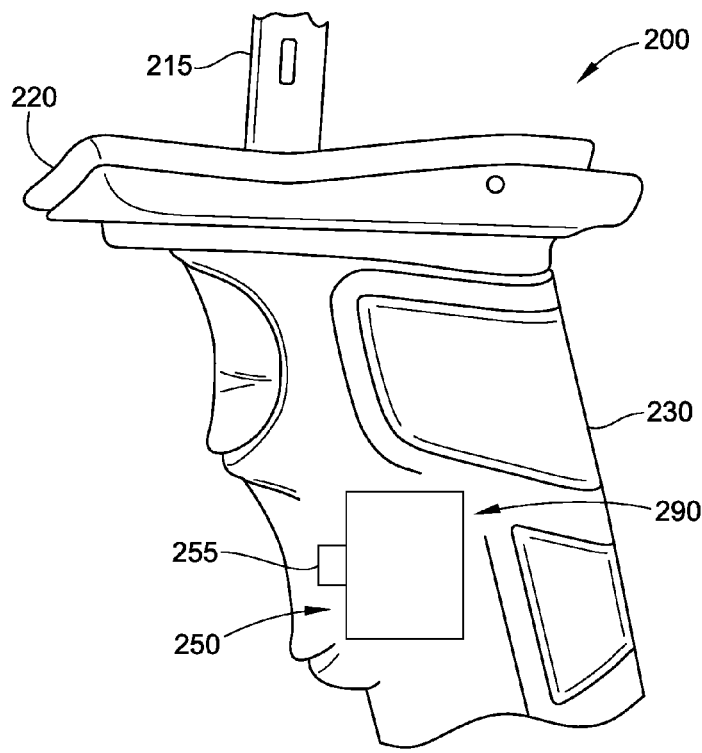
FIG. 3 shows an illustrative embodiment of a mobile computing device according to this disclosure.
Figure 4:
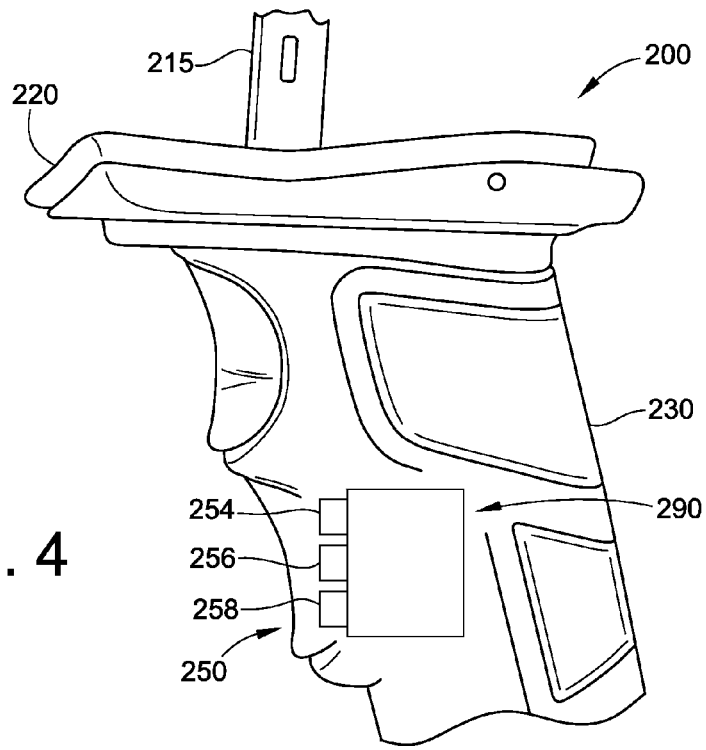
FIGS. 4 and 5 show alternative illustrative embodiments of a mobile computing device according to this disclosure.
Figure 5:
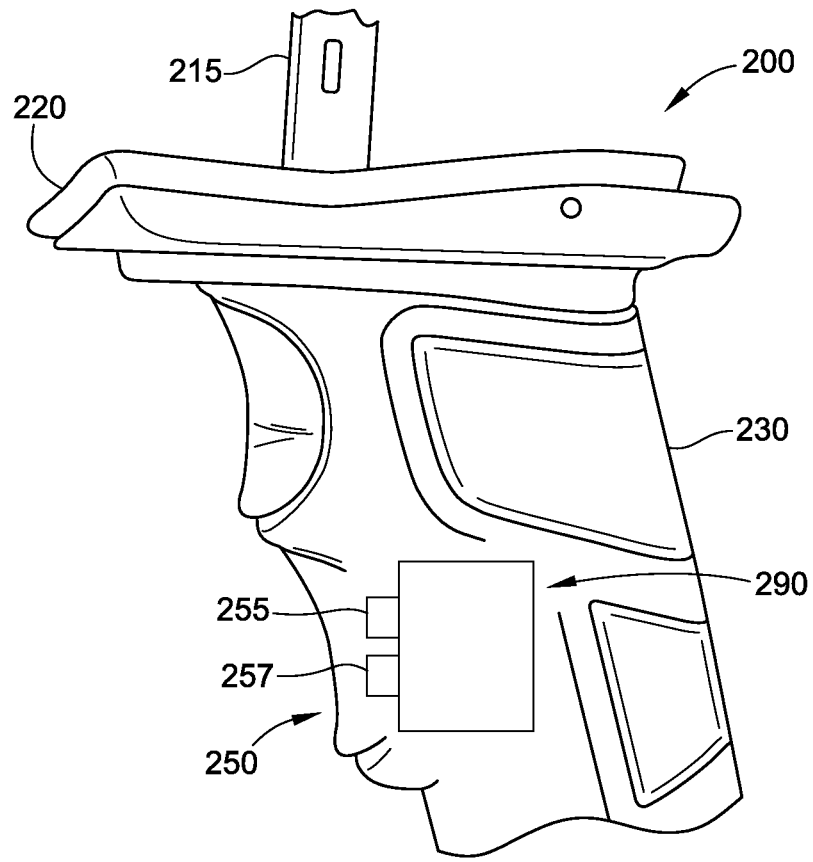

FIGS. 3, 4, and 5 show three illustrative configurations for mobile computing device according to this disclosure. FIGS. 3, 4, and 5 show a scanning device 210 including a mobile computing terminal 215 and a handle 230. The mobile computing terminal 215 includes a scanner 220 which generates a beam of light that is reflected off a bar code (not shown) back into the scanner 220. In FIG. 3, the handle 230 includes a trigger device 250 including a single trigger part 253. In FIG. 4, the handle 230 includes a trigger device 250 including a plurality of trigger parts shown as three trigger parts 254, 256, 258. In FIG. 5, the handle 230 includes a trigger device 250 including a plurality of trigger parts shown as two trigger parts 255 and 257. The plurality of trigger parts in this disclosure is a design variable dependent upon design criteria such as the number of functionalities requiring independent trigger mechanisms and the quality, efficiency, reliability, safety, ergonomics, and cost effectiveness of the number of trigger parts on the design. A trigger interface 290 also shown in FIGS. 3, 4, and 5 is discussed in detail below. When trigger device 250 is activated, the trigger device generates a mechanical pattern for selectively actuating the mobile computing function as hereinafter described.

Figure 6:
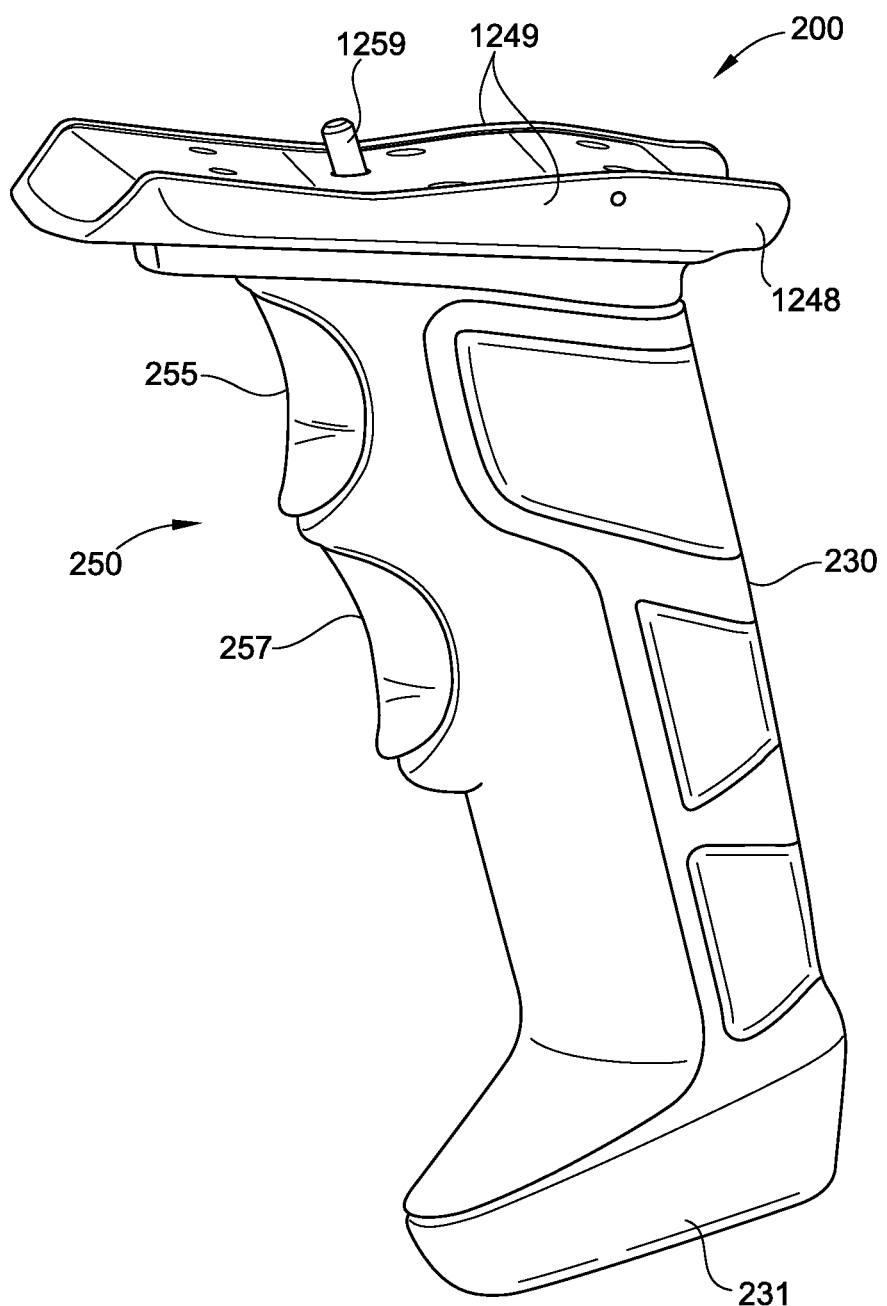
FIG. 6 shows one illustrative three-dimensional form factor for a handle useable with the mobile computing device shown in FIG. 5.

FIG. 6 shows one illustrative three-dimensional form factor for a handle 230 useable with the mobile computing device 200 shown in FIG. 5. The handle 230 includes a trigger device 250 including two trigger parts 255 and 257. The handle further includes a surface 1248 and a connector member 1259. The surface 1248 provides a surface for supporting a mobile computing terminal (not shown) against the handle. The connector member 1259 provides a mechanism for connecting the mobile computing terminal to the handle. Illustratively, the connector may be a threaded bolt extending upwardly from the surface 1248 for receiving a threaded female connector which is illustratively defined in the mobile computing terminal. The mobile computing terminal is attached to the threaded bolt in one illustrative embodiment by screwing engagement of the bolt and the female connector. The threaded bolt illustratively extends through the entire length of handle 230 and includes a terminal end that illustratively extends outwardly from the butt end 231 of the handle for receiving a wing nut or other attachment mechanism. The butt end of the scan handle may be recessed in order to sink the terminal end of the threaded bolt and the wing nut into the recess formed by the scan handle in order to allow the butt end of the scan handle to be seated onto flat or other surfaces without interference by the threaded bolt.

In this embodiment, the wing nut is configured to traverse a portion of the length of the bolt for providing a tightening force to the mobile computing terminal against the scan handle. In an alternative embodiment, the threaded bolt may terminate in a head member that is configured to be seated against an opposing side to surface 1248 for providing a tightening force to the mobile computing terminal against the scan handle as the mobile computing terminal is screwingly engaged to the connector 1259. It will be appreciated that connector member 1259 may be used alone or in combination with or replaced with other connectors designed to hold the mobile computing terminal to the scan handle. For instance, the handle may include a pair of upwardly extending members 1249 that are inwardly cambered to provide a biasing force against a mobile computing device that is received between the members when placed onto the surface 1248.

Figure 7A:
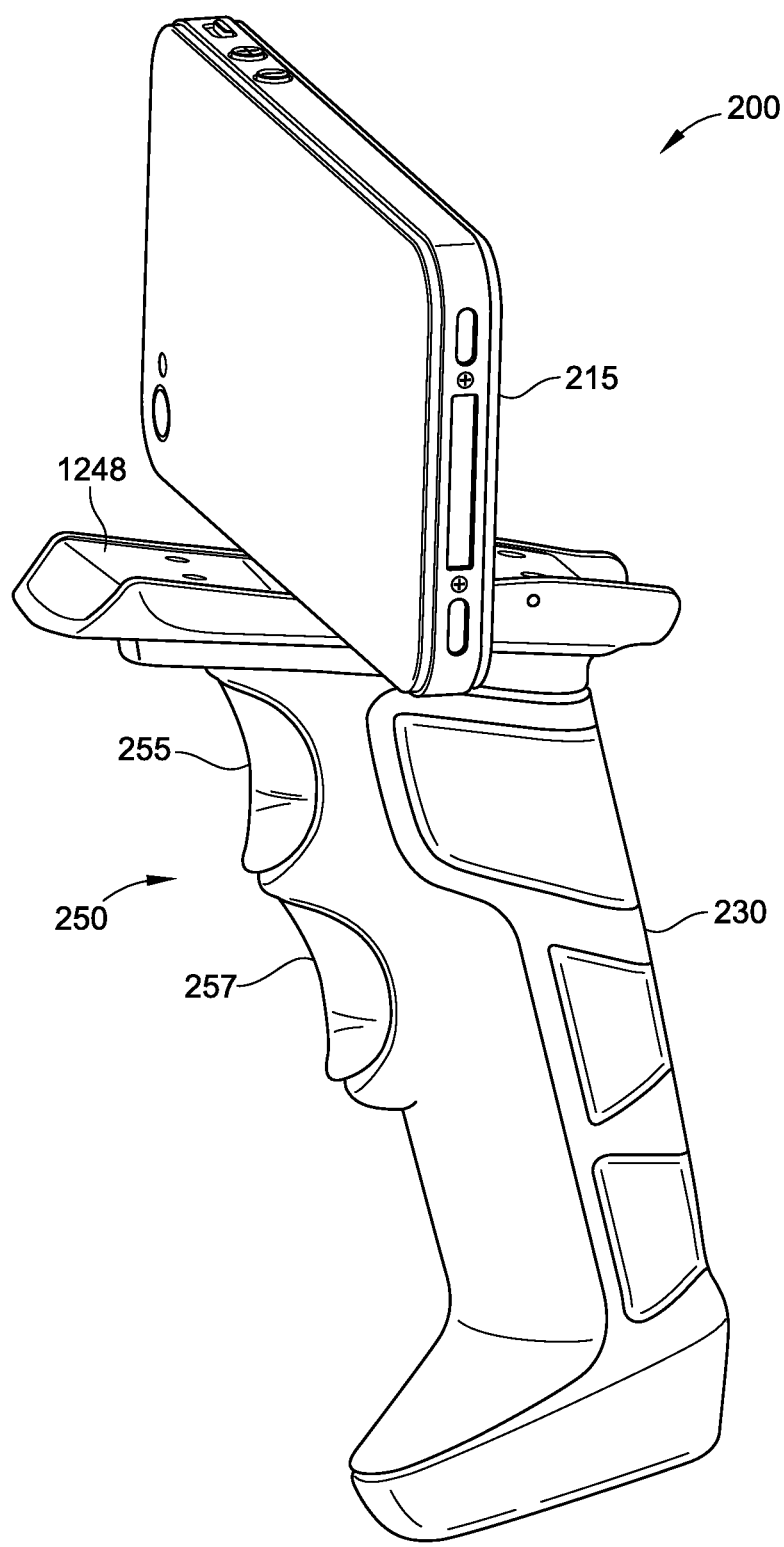
FIG. 7A shows the attachment of a mobile computing terminal to the scan handle illustrated in FIG. 6.

FIG. 7A shows the attachment of a mobile computing terminal 215 to the scan handle 230 illustrated in FIG. 6. Illustratively, the mobile computing terminal is an iPhone™ mobile computing terminal manufactured by Apple Inc. In this embodiment, the camera of the IPhone is orientated to allow use of the camera as the imaging engine for the scanner decoder 220 (shown in FIG. 5). But this disclosure is not limited to the iPhone™ mobile computing terminal and any mobile computing device may be used with this disclosure.

Figure 7B:
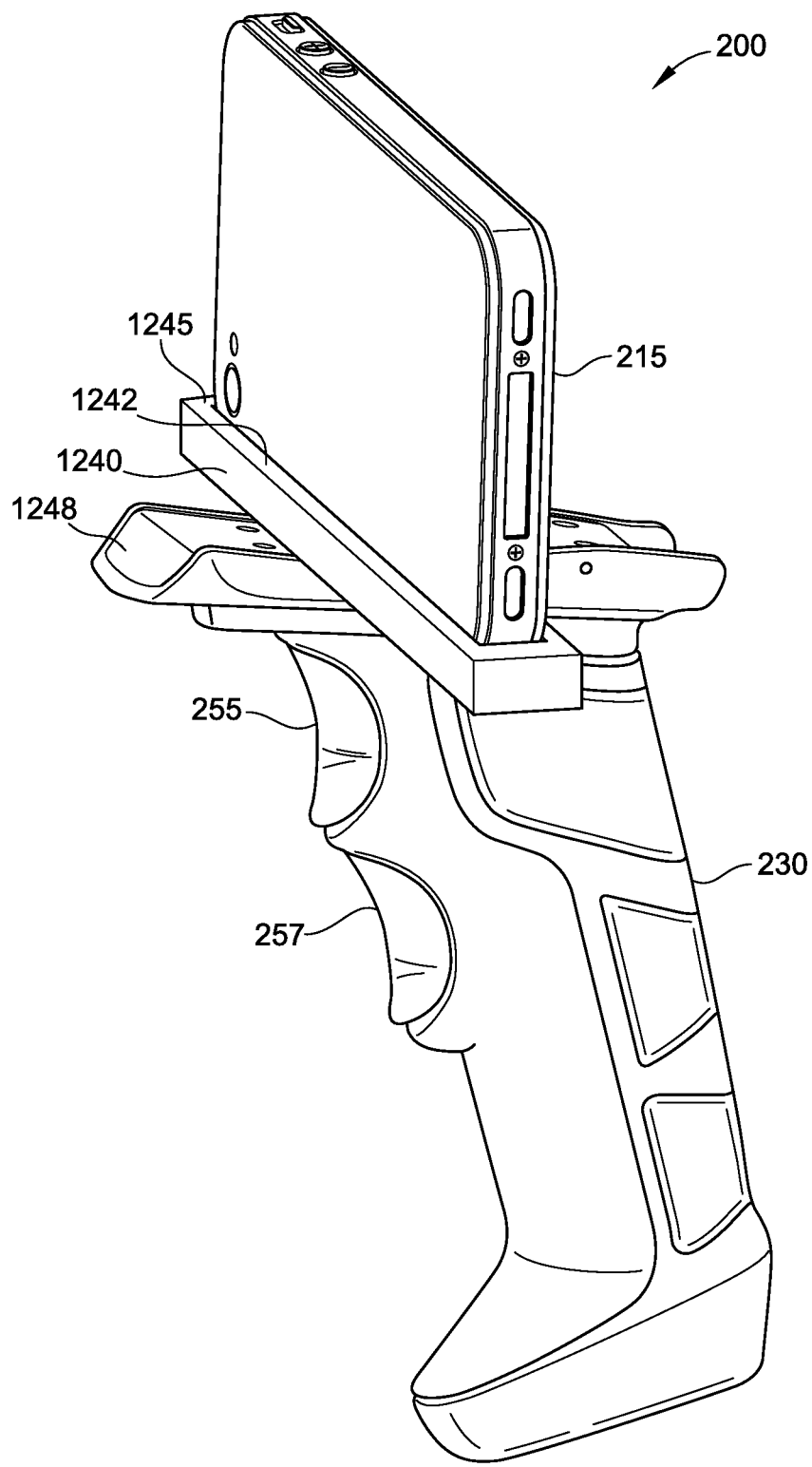
FIG. 7B illustrates yet another mechanism for connecting a mobile computing terminal to the handle illustrated in FIG. 6.

In FIG. 6, a connecting member 1259 was illustratively shown as one mechanism for connecting a mobile computing terminal to a scan handle. Further, other connection mechanisms were discussed in connection with FIG. 6. FIG. 7B illustrates yet another mechanism for connecting an iPhone™ mobile computing terminal to the handle 230. Specifically, FIG. 7B shows a mobile computing device 200 including a connector 1240 defining a recess 1245 for receiving the iPhone™ mobile computing terminal in a tight engagement. There is no connecting member 1259 used in this illustrative example. As shown in FIG. 7B, the recess is configured to hold the iPhone™ mobile computing terminal firmly against the surface 1248 of the scan handle in order to allow the scan handle with mobile computing terminal to be used as a unitary mobile computing device according to this disclosure. Illustratively, the tight engagement provided by the connector 1240 further allows for mechanical vibrations that are applied to the connector 1240 by the action of the trigger parts 255, 257 to pass through to the mobile computing device. In alternative embodiments discussed in this disclosure wherein the mechanical vibrations are converted to electrical signal patterns along or inside the scan handle, there may be little or no need for the transfer of mechanical vibrations to the mobile computing terminal attached to the handle in which case the primary design criteria for the connector used in this example may be to provide a connection of the mobile computing device to the scan handle that allows for the mobile computing device and scan handle to be used as a unitary device and without scratching the surface of the mobile computing device or interfering with its operation.

Figure 8:
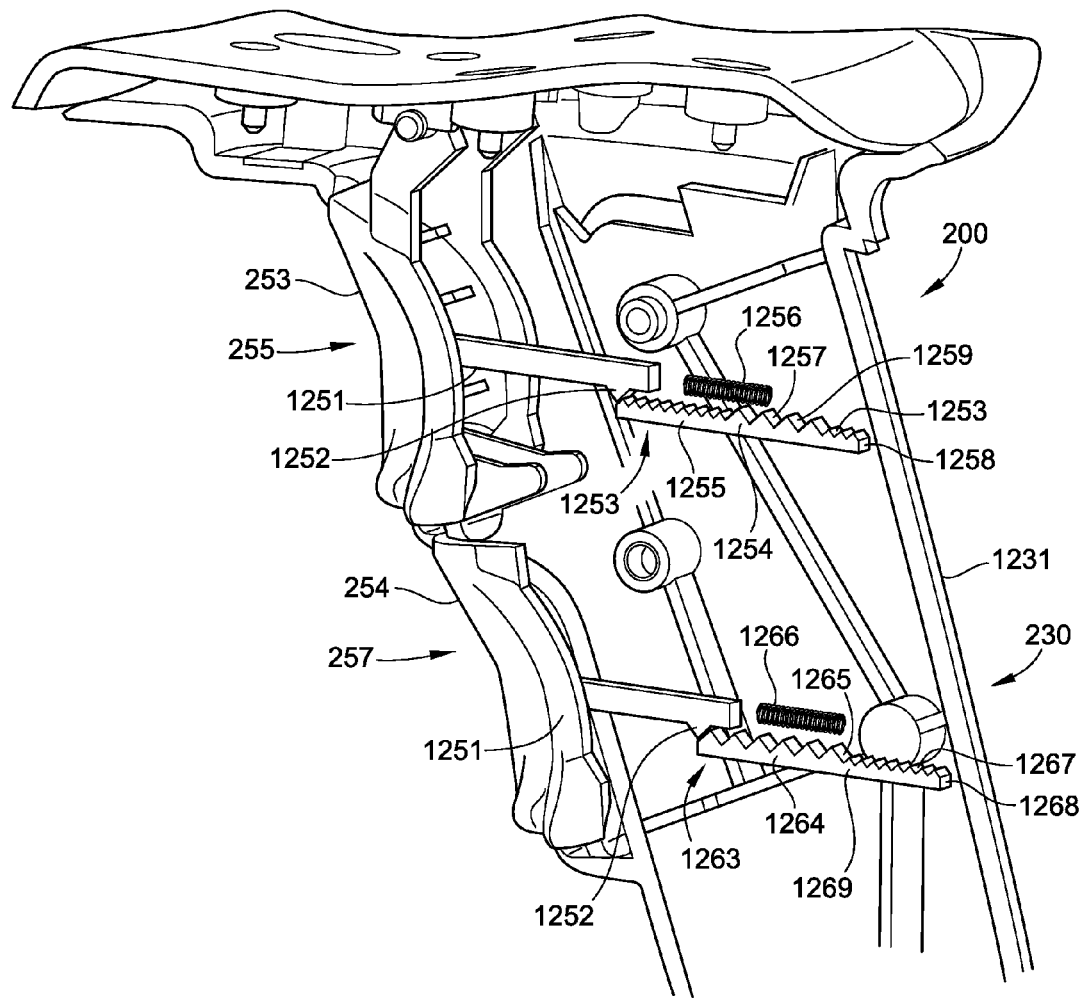
FIG. 8 shows an illustrative embodiment of the mobile computing device with two trigger parts of FIG. 5 as illustratively embodied in the form factor shown in FIG. 6.

FIG. 8 shows an illustrative embodiment of the mobile computing device with two trigger parts 255, 257 of FIG. 5 as illustratively embodied in the form factor shown in FIG. 6. Illustratively, trigger device 255 comprises a trigger contact face 253 connected to a pawl 1251 having a downwardly extending tooth 1252 for engagement with a racheted bar 1254 having upwardly extending teeth 1253. The racheted bar 1254 includes a terminal end 1258 that is in contact with a surface 1231 of the handle 230. A spring 1256 is mounted in the handle for biasing the pawl 1251 and trigger contact face 253 in a direction away from the handle. Illustratively, a force is applied to the contact face 253 by a finger pull that pulls the trigger contact face 253 and connected pawl toward the handle against the force of the spring 1256. In doing so, the tooth 1252 of the pawl is caused to travel inwardly along the upwardly extending teeth 1253 of the racheted bar 1254 under the influence of the trigger pull. On release of the pull force on the trigger face 253, the force of the spring 1256 urges the trigger contact face 253 and the pawl 1251 to return to the neutral position. In doing so, the tooth 1252 of the pawl is caused to travel outwardly along the upwardly extending teeth 1253 of the racheted bar 1254 under the influence of the spring force.

Similarly, trigger device 257 comprises a trigger contact face 254 connected to a pawl 1261 having a downwardly extending tooth 1262 for engagement with a racheted bar 1264 having upwardly extending teeth 1263. The racheted bar 1264 includes a terminal end 1268 that is in contact with a surface 1231 of the handle 230. A spring 1266 is mounted in the handle for biasing the pawl 1261 and trigger contact face 263 in a direction away from the handle. Illustratively, a force is applied to the contact face 255 by a finger pull that pulls the trigger contact face 254 and connected pawl toward the handle against the force of the spring 1266. In doing so, the tooth 1262 of the pawl is caused to travel inwardly along the upwardly extending teeth 1263 of the racheted bar 1264 under the influence of the trigger pull. On release of the pull force on the trigger face 254, the force of the spring 1266 urges the trigger contact face 254 and the pawl 1261 to return to the neutral position. In doing so, the tooth 1262 of the pawl is caused to travel outwardly along the upwardly extending teeth 1263 of the racheted bar 1264 under the influence of the spring force.

Advantageously, the travel of each of the tooth 1252 of the pawl 1251 along the upwardly extending teeth 1253 of the racheted bar 1254 and of the tooth 1262 of the pawl 1261 along the upwardly extending teeth 1263 of the racheted bar 1264 produce mechanical vibrations. These mechanical vibrations are advantageously applied to the handle 230 through each of the terminal end 1258 of the racheted bar 1254 and the terminal end 1268 of the racheted bar 1264 which is in contact with the surface 1231 of the handle 230. Hence, each of trigger parts 255 and 256 are seen to generate mechanical vibrations by the trigger pull and release of the trigger contact face of the part.

Figure 9:
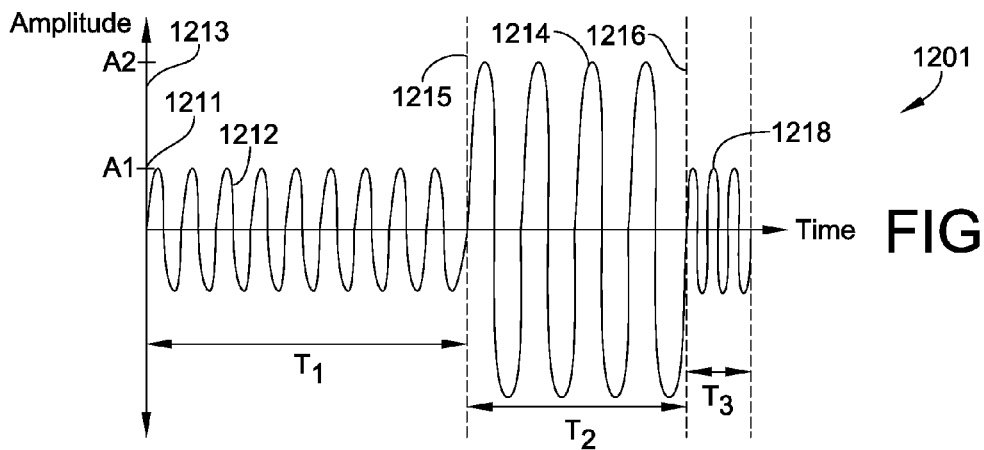
FIGS. 9 and 10 show mechanical vibration patterns generated by a trigger pull and release, respectively, of one of the two trigger parts—namely, trigger part 255—shown in FIG. 8.

As illustrated in FIG. 8, the upwardly extending teeth 1253 of the racheted bar 1254 includes a first set of teeth 1255, a second set of teeth 1259, and a third set of teeth 1253. As shown, the first set of teeth 1255 and the third set of teeth 1253 are configured to have a first frequency and a first amplitude while the second set of teeth 1259 is configured to have a second frequency and a second amplitude. The vibrations that are generated by the mobile computing device of FIG. 8 by a trigger pull of trigger part 255 is illustrated in FIG. 9 showing these mechanical vibrations plotted against time. Both FIGS. 8 and 9 will be referred to in the following discussion. Referring to FIG. 8, the trigger pull on trigger part 255 causes the tooth 1252 of the pawl 1251 to travel along the upwardly extending teeth 1253 of the racheted bar 1254. As seen in FIG. 8, the tooth 1252 of the pawl 1251 travels first across the first set of teeth 1255 and the action of the tooth 1252 against the first set of teeth 1255 causes the generation of a first mechanical vibration having the first frequency and the first amplitude defined by the first set of teeth 1255. This first mechanical vibration is shown in FIG. 9 as mechanical vibration 1212 having an amplitude 1211 and the indicated first frequency and defined to occur with a period T1. Referring back again to FIG. 8, the tooth 1252 of the pawl 1251 travels next across the second set of teeth 1259 and the action of the tooth 1252 against the second set of teeth 1259 causes the generation of a second mechanical vibration having the second frequency and the second amplitude defined by the second set of teeth 1259. This second mechanical vibration is shown in FIG. 9 as mechanical vibration 1214 having an amplitude 1213 and the indicated second frequency and defined to occur within a period of time T2. Referring back again to FIG. 8, the tooth 1252 of the pawl 1251 travels finally across the third set of teeth 1253 and the action of the tooth 1252 against the third set of teeth 1253 causes the generation of a third mechanical vibration having the first frequency and the first amplitude defined by the third set of teeth 1253 and defined to occur within a period of time T3. This third mechanical vibration is shown in FIG. 9 as mechanical vibration 1218 having the first indicated amplitude 1211 and the indicated first frequency and a period of time T3. The amplitude and frequency of the third mechanical vibration 1218 is the same as the first mechanical vibration 1212 although the period of time defined for that vibration is different.

Figure 10:
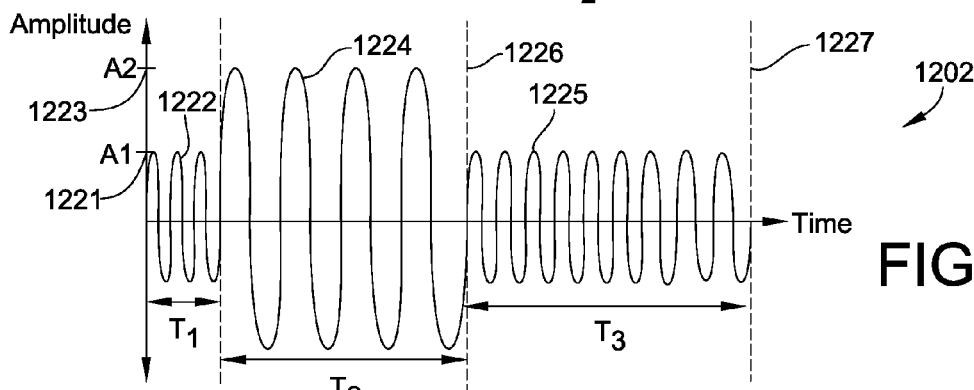

FIG. 10 shows the mechanical vibrations plotted against time of the mechanical vibrations that are generated by the mobile computing device of FIG. 8 by a trigger release of trigger part 255. The travel of the tooth 1252 of the pawl 1251 across the upwardly extending teeth 1253 of the racheted bar 1254 are in the reverse order of the travel illustrated with the trigger pull shown in FIG. 9. Hence, the first mechanical vibration 1222 and the third mechanical vibration 1225 are in reverse order in the trigger release shown in FIG. 10 than the order of these vibrations in the trigger pull shown in FIG. 9; with the first mechanical vibration having the shorter period of time when compared to the third mechanical vibration which vibrations otherwise have the same frequency and amplitude.

Advantageously, FIGS. 9 and 10 show the same trigger part 255 generating two different mechanical vibrations—a first for a trigger pull and a second for a trigger release. This unique mechanical vibrational fingerprint generated by each of trigger pull or release allows the processor and control software to recognize which trigger a user is activating and whether the activation is a pull or release.

Figure 11:
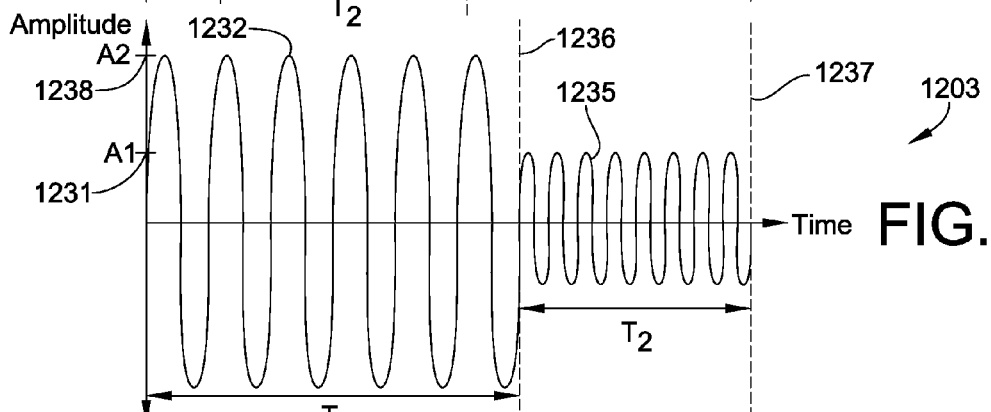
FIGS. 11 and 12 show mechanical vibration patterns generated by a trigger pull and release, respectively, of a second of the two trigger parts—namely, trigger part 257—shown in FIG. 8.
Figure 12:
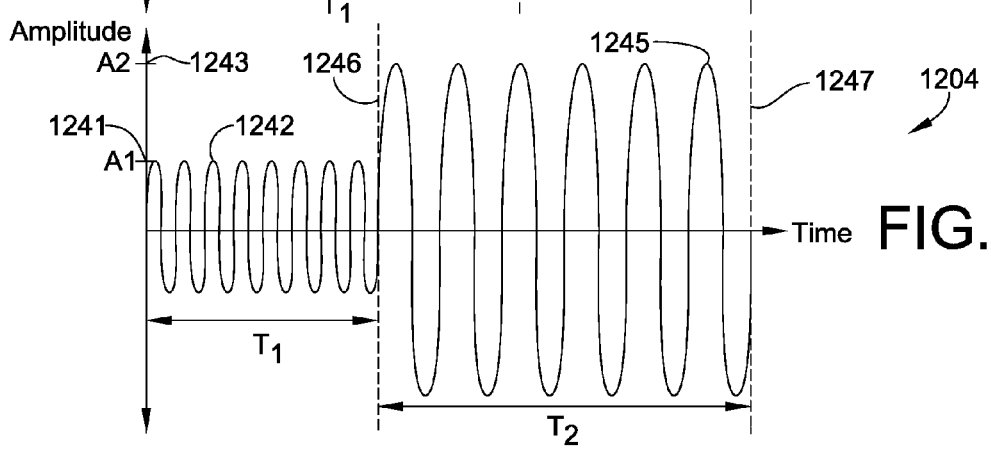

FIGS. 11 and 12 illustrate yet two further unique mechanical vibrations generated by the device of this disclosure, in these two figures, by the pull or pull action on the second of the two trigger parts—namely, trigger part 257.

Referring again to FIG. 8, the tooth 1262 of the pawl 1261 travels first across the first set of teeth 1265 and the action of the tooth 1262 against the first set of teeth 1265 causes the generation of a first mechanical vibration having the first frequency and the first amplitude defined by the first set of teeth 1265. This first mechanical vibration is shown in FIG. 11 as mechanical vibration 1232 having an amplitude 1233 and the indicated first frequency and defined to occur with a time period T1. The tooth 1262 of the pawl 1261 travels next across the second set of teeth 1269 and the action of the tooth 1262 against the second set of teeth 1269 causes the generation of a second mechanical vibration having the second frequency and the second amplitude defined by the second set of teeth 1269. This second mechanical vibration is shown in FIG. 10 as mechanical vibration 1235 having an amplitude 1231 and the indicated second frequency and defined to occur within a period of time T2.

FIG. 12 shows the mechanical vibrations plotted against time of the mechanical vibrations that are generated by the mobile computing device of FIG. 8 by a trigger release of trigger part 257. The travel of the tooth 1262 of the pawl 1261 across the upwardly extending teeth 1263 of the racheted bar 1264 are in the reverse order of the travel illustrated with the trigger pull shown in FIG. 11. Hence, the first mechanical vibration 1242 and the second mechanical vibration 1245 are in reverse order in the trigger release shown in FIG. 12 than the order of these vibrations in the trigger pull shown in FIG. 11; with the first mechanical vibration having the higher frequency occurring first in this illustrative embodiment.

Advantageously, FIGS. 9-12 show two trigger parts 255, 257 generating two different mechanical vibrations—a first for a trigger pull and a second for a trigger release. Four unique fingerprints are thus generated by the device of the FIG. 8 embodiment based on the trigger action and whether the activation is a trigger pull or release. These unique fingerprints allow the processor and control software to recognize which trigger a user is activating and whether the activation is a pull or release and to process the activation accordingly. It will be apparent that any number of trigger parts may be used to generate any number of mechanical vibrations that may be defined in any number of ways including using parameters such as amplitude, frequency, period of time, number of vibrations, the ordering of a number of vibrations, signal patterns included in a vibration, and the duration of time between vibrational signal patterns. The processor may be configured to differentiate between vibrations based on these and other patterns that may be unique to a vibration; upon when a vibration is generated in time; or upon how the vibration has been modulated. This disclosure thus creates a language based on mechanical vibrational patterns for use by a communicating device in communicating; a language based on mechanical vibrational pattern recognition.

Figure 13:
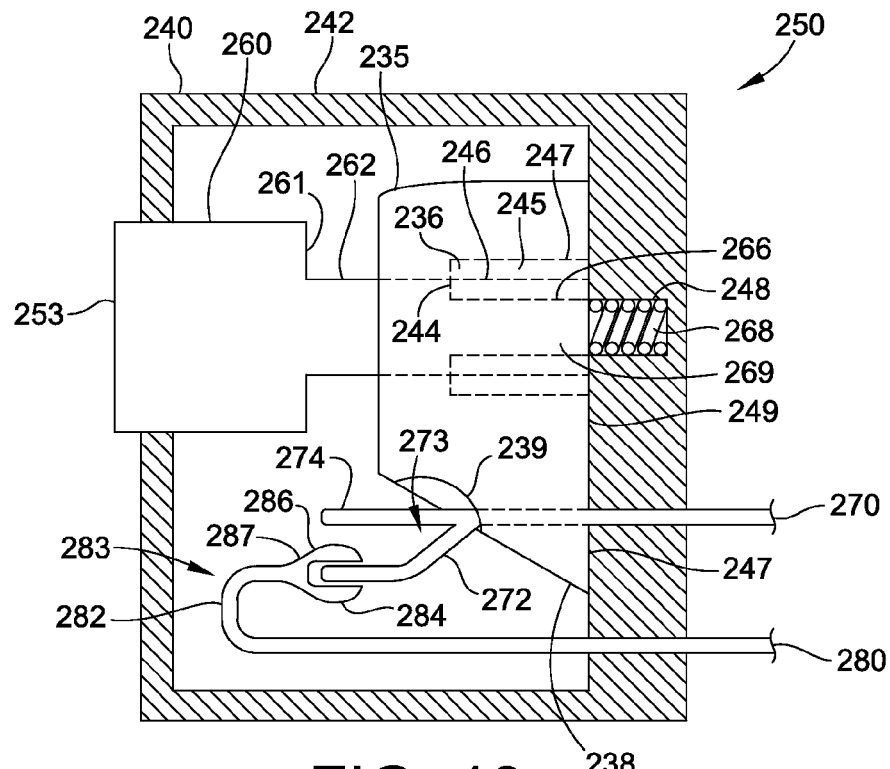
FIGS. 13 and 14 show an alternative illustrative trigger device for use in the scanning device of FIG. 3 according to this disclosure.
Figure 14:
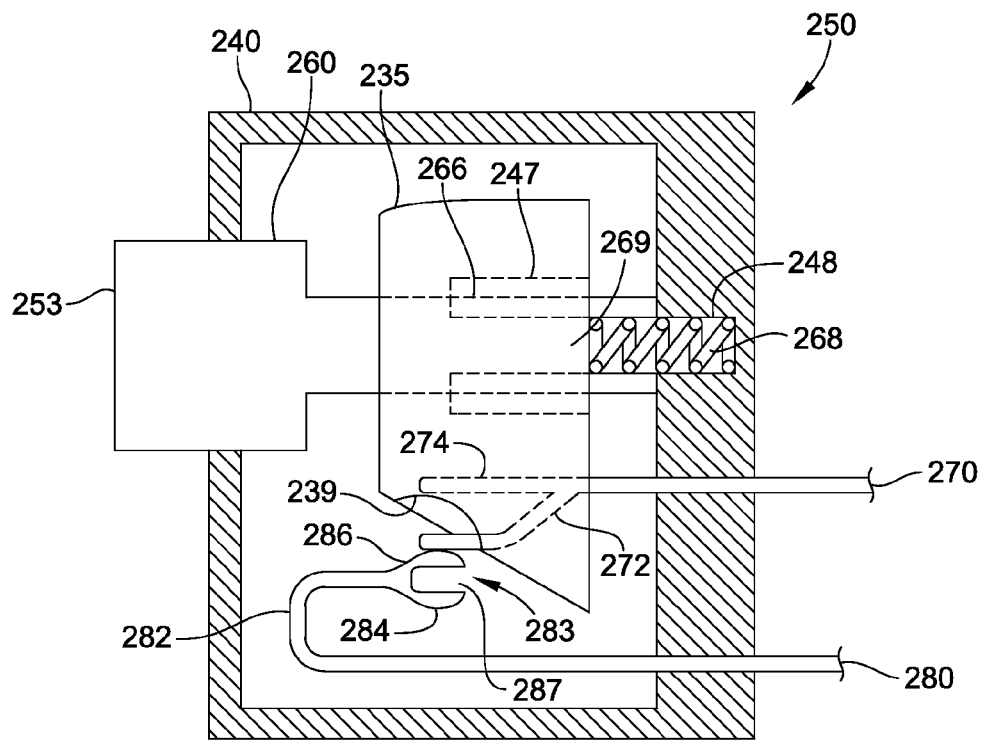

FIGS. 13 and 14 show another illustrative trigger device 250 for use in the scanning device 210 shown in FIG. 3. As shown in FIGS. 13 and 14, trigger device 250 is configured to include a single trigger part 253, a tuning device 270, a tuning device activator 280, and a support housing 240. The support housing includes a sidewall 242 and a floor 249 defining a first bore 248 and including an upwardly extending member 247 defining a second bore 246. Trigger part 253 includes a push button 260 having a mid-section 262 and a lower-section 266. The lower-section has a smaller diameter than the mid-section which has a smaller diameter than the push button 260. The lower-section 266 of trigger device slideably engages the first bore 248 defined in the support housing 240 and the mid-section 262 of the trigger device slideably engages the second bore 246 defined in the upwardly extending member 247 of the support housing. A spring 268 is seated in the first bore and a terminal end 269 of the trigger part is disposed against the spring for biasing the trigger part in an outwardly direction. A collar 235 is snugly engaged about the trigger part. The collar 235 has an opening 239 for allowing first and second members 272 and 274 of tuning fork 270 to extend there through and a beveled part 238 that is in contact with a first arm 286 of the tuning device activator 280 when the trigger part 253 is in the neutral position shown in FIG. 14.

When the trigger part 253 is in the neutral position shown in FIG. 14, the beveled part 238 of the collar 235 maintains the first arm 286 of the tuning device activator 280 spatially away from the tuning fork so that the tuning force does not vibrate. When the trigger part 253 is depressed by application of a physical force in the direction of the support housing 240, the mid-section 262 and the lower-section 266 of the trigger part travel inside the second bore 246 and first bore 248, respectively, causing the terminal end 269 of the trigger part to bias the spring 268. As the trigger part moves toward the support housing 240, the beveled part 238 of the collar moves away from the first arm 286 of the tuning device activator 280 causing the tuning fork 270 to mechanically vibrate. FIG. 13 shows the trigger part after it has been depressed to create the mechanical vibration.

Figure 15:
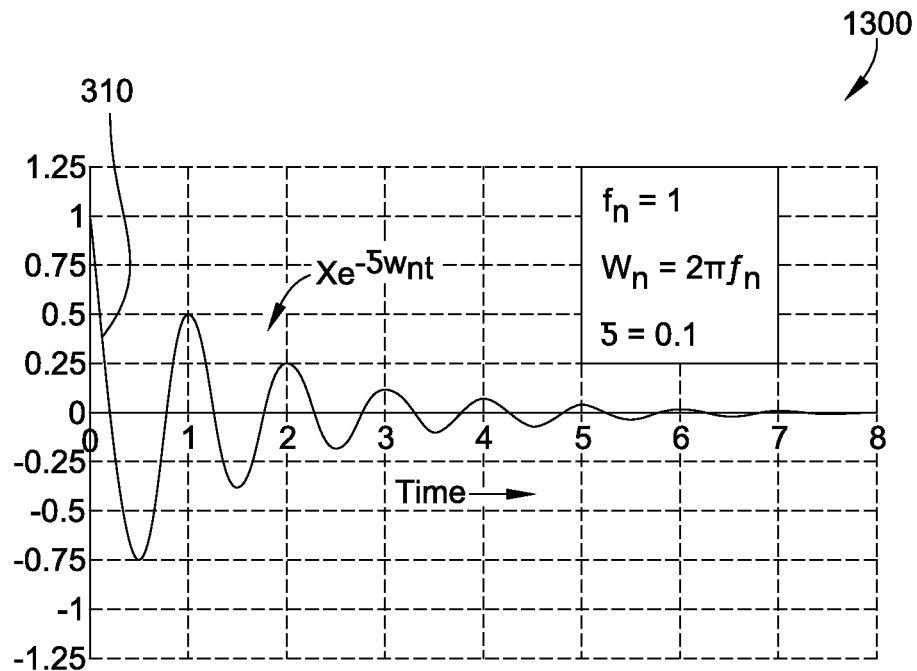
FIGS. 15 and 16 show a first and a second mechanical vibration pattern, respectively, that may be generated by the trigger part shown in FIGS. 13 and 14, respectively, based upon the trigger part design.
Figure 16:
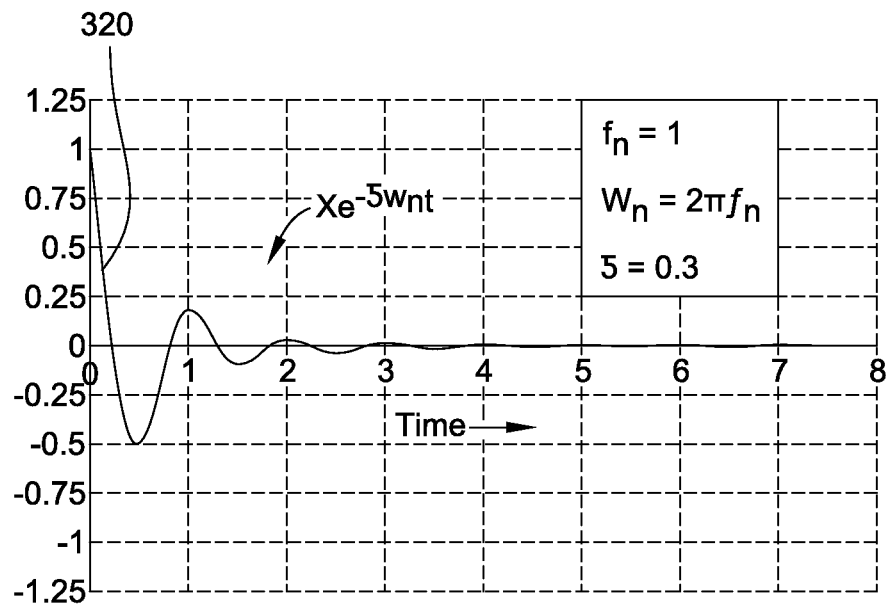

FIG. 15 shows one mechanical vibration pattern 310 that may be generated by trigger part 253 described in FIGS. 13 and 14. In FIG. 15, the tuning fork 270 is configured to provide a natural frequency of 1, a resonant frequency of $2\pi fn$ and a damping coefficient of 0.1. Alternatively, the tuning fork may be configured to provide a different mechanical vibration pattern. For example, FIG. 16 shows another mechanical vibration pattern 320 generated by a tuning force configured to have a damping coefficient of 0.3. It will thus be appreciated that the tuning fork of this disclosure can be configured to provide different mechanical vibration patterns. In the same way, trigger devices of this disclosure may be configured to provide different mechanical vibration patterns in accordance with this disclosure.

The trigger devices shown in the FIGS. 8, 13 and 14, or any other trigger devices disclosed herein may be used to create a trigger device 250 for a scanning device 210 having a plurality of trigger parts 254, 256, and 258 as shown in FIG. 4. Advantageously, these or other one or more trigger devices may be used to create a vocabulary of mechanical vibration patterns; each mechanical vibration pattern being associated with one or more computing functions of the mobile computing device. For example, in the mobile computing device 250 of FIG. 4, a trigger part 254 of trigger device may be configured to generate a first mechanical vibration pattern, a trigger part 256 of trigger device may be configured to generate a second mechanical vibration pattern, and a trigger part 258 of trigger device may be configured to generate a third mechanical vibration pattern depending upon the activation of trigger parts 254, 256, or 258. In an alternative illustration, additional mechanical vibration patterns may be generated by activating one or more of trigger parts 254, 256, and 258 simultaneously. In yet another illustrative embodiment, one or more of trigger parts 254, 256 and 258 may be activated alone or in combination one or more times within a predetermined period of time to provide yet further more complex mechanical vibration patterns. In yet another example, the tonal modulation provided by the trigger device is based on the number of activations of the trigger device. In another example, the tonal modulation is based on the speed of activation of the trigger device. These and other tonal modulations provided by the trigger device are provided by this disclosure.

Any one unique mechanical vibration pattern may provide a unique vocabulary word to the language that the trigger device may evoke to communicate to the mobile computing device. By combining the vocabulary words of unique mechanical vibration patterns into sentences, paragraphs, etc., this disclosure provides a new language for use by the mobile computing device in activating mobile computing functions.

Figure 17A:
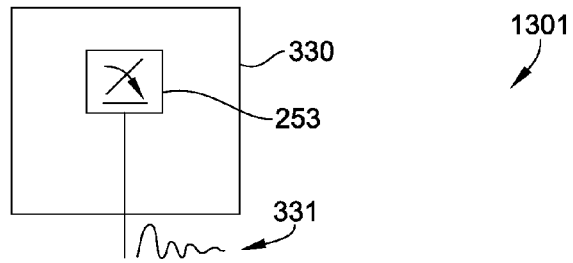
FIGS. 17A-17G show illustrative mechanical vibration patterns generated by trigger device according to this disclosure.
Figure 17B:
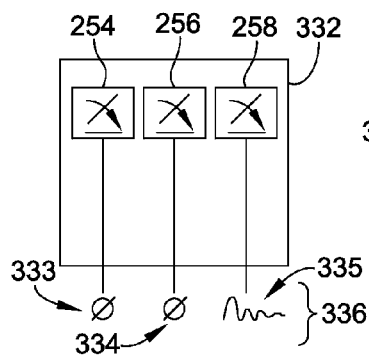
Figure 17C:
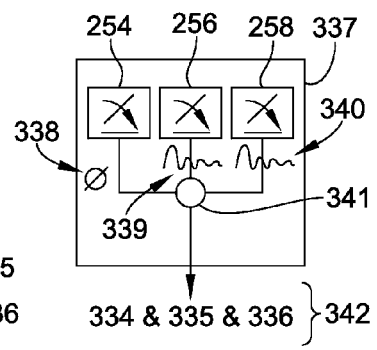
Figure 17D:
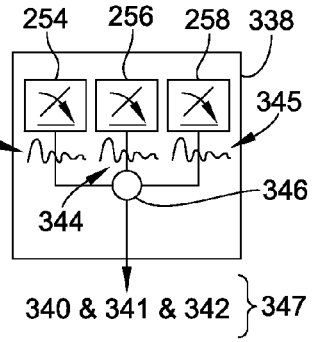

FIGS. 17A-17G further illustrate the power of the new language by which a trigger device may communicate with a mobile computing device according to this disclosure. FIG. 17A shows trigger device 330 comprising device part 253 of FIGS. 3, 4 and 5 in the closed position generating a mechanical vibration pattern 331. FIGS. 17B, 17C, and 17D show trigger devices 332, 337, and 338 each comprising device parts 254, 256, and 258. In FIG. 17B, these parts are in the open-open-closed positions; in FIG. 17C, in the open-closed-closed positions; and in FIG. 17D in the closed-closed-closed positions. The output from trigger device 332 shown in FIG. 17B are three independent mechanical vibration patterns 333, 334, and 335. The output from trigger device 337 shown in FIG. 17C is one mechanical vibration pattern 342 which is the superposition of mechanical vibrations 334, 335, and 336 by adder 341. The output from trigger device 339 shown in FIG. 17D is likewise one mechanical vibration pattern 347 which like in FIG. 17C is the superposition of three mechanical vibrations but of different mechanical vibration patterns 343, 344, and 345 in this example. Hence, the output mechanical vibration pattern 347 in FIG. 17D is different from the mechanical vibration pattern shown in FIG. 17C because a different combination of trigger parts 254, 256, and 258 are activated than are activated in FIG. 17C.

Figure 17E:
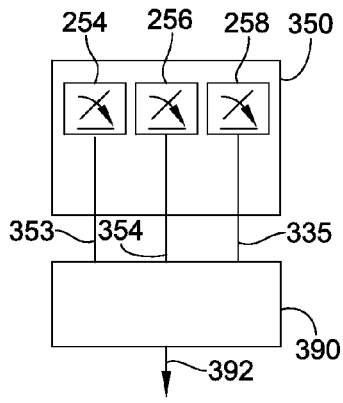
Figure 17F:
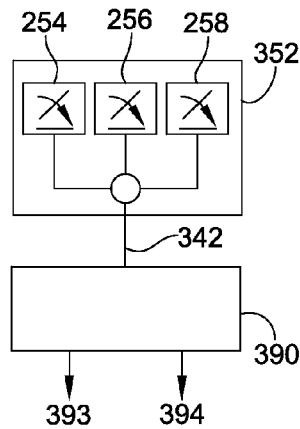
Figure 17G:
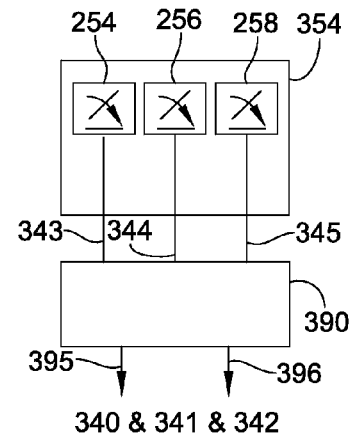

FIGS. 17E, 17F, and 17G show the mechanical vibration patterns generated by trigger devices 350, 352, and 354 applied to a trigger interface 390 of this disclosure in all three FIGS. Illustratively, trigger interface 390 converts the mechanical vibration signals into a single electrical signal 392 as shown in FIG. 17E. However, as shown in FIG. 17F, the trigger interface may convert one incoming mechanical vibration signal into more than one electrical signal. For example, mechanical vibration pattern 342 is converted into electrical patterns 393 and 397 in FIG. 17F. Alternatively, as shown in FIG. 17G, the trigger interface may convert more than one incoming mechanical vibration pattern into more than one electrical signal. For example, mechanical vibration patterns 343, 344, and 345 generated by trigger device 354 are converted into two electrical patterns 395 and 396 by trigger interface in the example shown in FIG. 17G.

It will be appreciated that trigger device may also include a decoder for decoding the mechanical vibration pattern into mechanical vibration components. For example, if activation of a trigger device introduces several frequency components into the vibration pattern, the trigger device may decode the vibration pattern using filters to remove higher order harmonic frequencies; thereby providing a vibration pattern at the natural frequency of the trigger activation.

Figure 18:
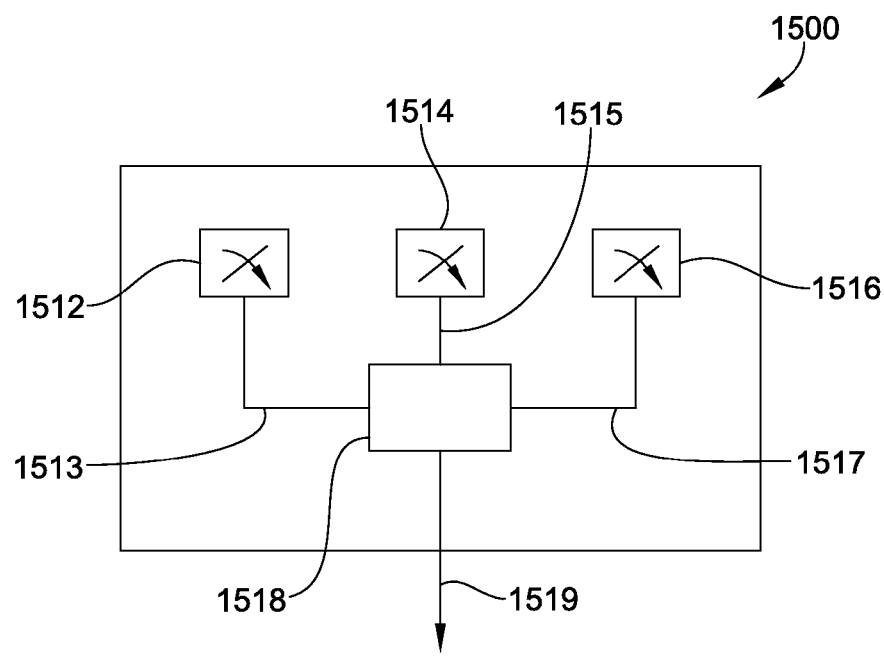
FIG. 18 shows an alternative illustrative embodiment of a trigger device of this disclosure and the analog protocol (vibrational patterns) it creates for communicating data.

FIG. 18 shows an alternative illustrative embodiment of a trigger device 1500 of this disclosure and an analog protocol (vibration patterns) 1520 it uses for communicating data. Trigger device 1500 comprises device parts 1512, 1514, and 1516, and a mechanical multiplexer 1518. The mechanical multiplexer accepts a plurality of streams of data (specifically, the three streams generated by device parts 1512, 1514, and 1516, in this example) and combines them into one stream of data that is applied to vibrational signal line 1519. The data on line 1519 is the vibration pattern that travels along the mobile computing device and is picked up by the trigger interface, which modulates the tones or data contained within the vibration pattern into an electrical form that the processor may you use for controlling computing functions.

The multiplexing illustratively occurs by time-division multiplexing in which the data streams are interleaved through the use of time delays that shift the phase of each data stream with respect to each other. Alternatively, the multiplexing may give each data stream a different frequency using frequency-division multiplexing (FDM) techniques. It will be appreciated that any techniques for modulating the stream of data from device parts 1512, 1514, and 1516 may be used with this disclosure.

In the illustrative example shown in FIG. 18, in which the data streams from trigger parts are multiplexed, a trigger interface for use in converting the modulated vibration pattern in this example illustratively includes a demultiplexer for demodulating or separating the mixed data streams generated by the trigger device into an electrical pattern (e.g., tonal modulation).

The illustrative embodiment of FIG. 18 advantageously creates an analog protocol (vibrational patterns) 1520 that can be used to communicate data. As shown in FIG. 18, the analog protocol 1520 is illustrated in logic 1's and 0's for each of the device parts 1512, 1514, and 1516; with a logic 1 representative of a vibrational pattern that has been generated by the device part and a logic 0 indicating that the device part has not generated a vibrational pattern (i.e., representative of the absence of a vibrational pattern.) The 1's and 0's in the analog protocol 1520 representative of the modulated vibrational pattern on line mechanical vibration line 1519 advantageously provide logic for use in tables stored in the memory of the mobile computing device for use in decoding the triggers which is illustratively done by the trigger interface in this example.

In previous embodiments, the mobile computing device is illustratively configured to transmit a single trigger event to the processor through the trigger interface. More specifically, the activation of a single trigger or a plurality of triggers at the same time or within a specified period of time creates a single bit of data useable by the processor. By activating a single trigger or a plurality of triggers together at the same time or within a specified period of time, a multiple number of times within a predetermined period of time, the user may create streams of single bits of data for use by the processor in controlling the mobile computing device. The user may create streams of single bits of data in other ways according to this disclosure, such as by the creation of a bit of data based upon the speed of activation of a single trigger alone or a plurality of triggers together.

In the illustrative example of FIG. 18, the trigger device is configured to create multiple bits (one from each activated trigger) of data all within a single data package useable by the processor. This allows the computer to see data from a plurality of triggers at the same time; thereby allowing for the open-or-closed position of each of a multiple of triggers to define the task that the processor is called upon to perform by the selective activation of one or more of the plurality of triggers. Thus, the analog protocol of this disclosure enables the transmission of complex patterns of data based on the activation or non-activation of a combination of triggers. The activation of one or more of the triggers may occur at the same time or within a predetermined period of time and the open-or-closed states of all the triggers at that point may thus be included in a single data packet. In an alternative embodiment, the sequence in which the triggers are activated may also be used to provide further information to the processor with the sequence of activation of the plurality of triggers determining the functionality to be activated. For example, logic table 1520 in FIG. 18 shows four instances 1522, 1524, 1526, and 1528, in which two or more switches are shown activated. Taking instance 1522 in logic table 1520, for example, if the activation of switch 1514 occurs before the activation of switch 1516, the trigger interface may decipher this particular ordering of switch activations to mean activate the RFID function; whereas an activation of the switches in reverse order may mean activate the scan function. In these and other ways of imparting advanced logic to the processor based on the activation of a one or more of a plurality of triggers, the analog protocol 1520 adapted by the trigger device of FIG. 18 advantageously provides a table of advanced logic for use in decoding which triggers have been activated by the user. This enables the communication of even more complex data than is possibly from the transmission of a stream of single bits of data generated by a single trigger event or a plurality of trigger events contemporaneously, for example, as disclosed in the previous examples.

Figure 19A:
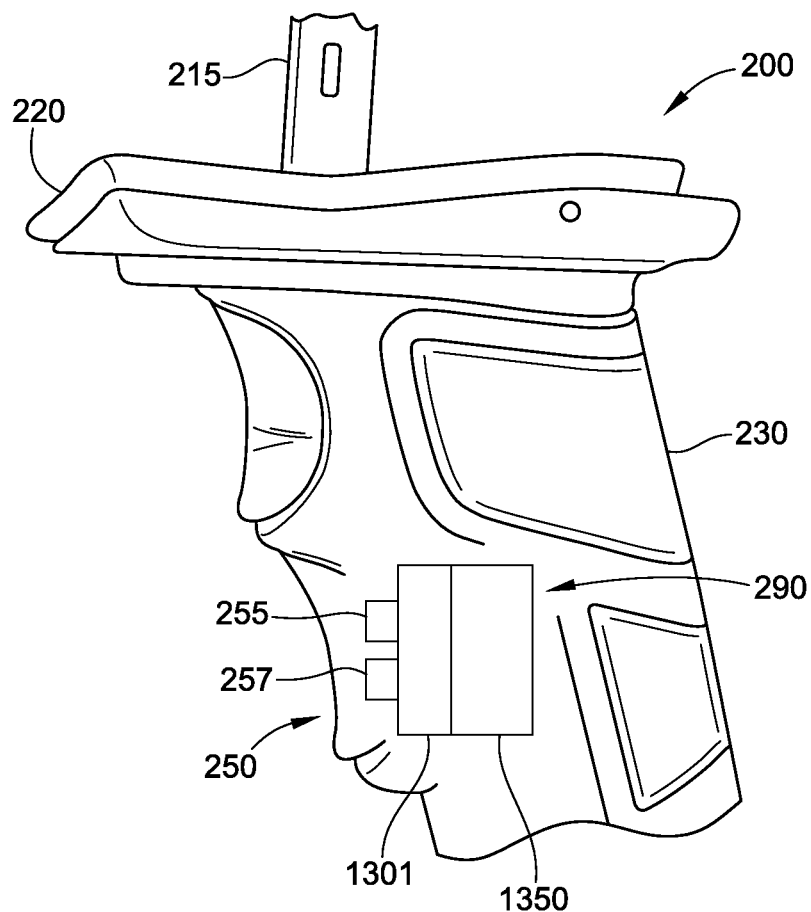
FIG. 19A shows an alternative illustrative embodiment of a mobile computing terminal illustrated in FIG. 5.
Figure 19B:
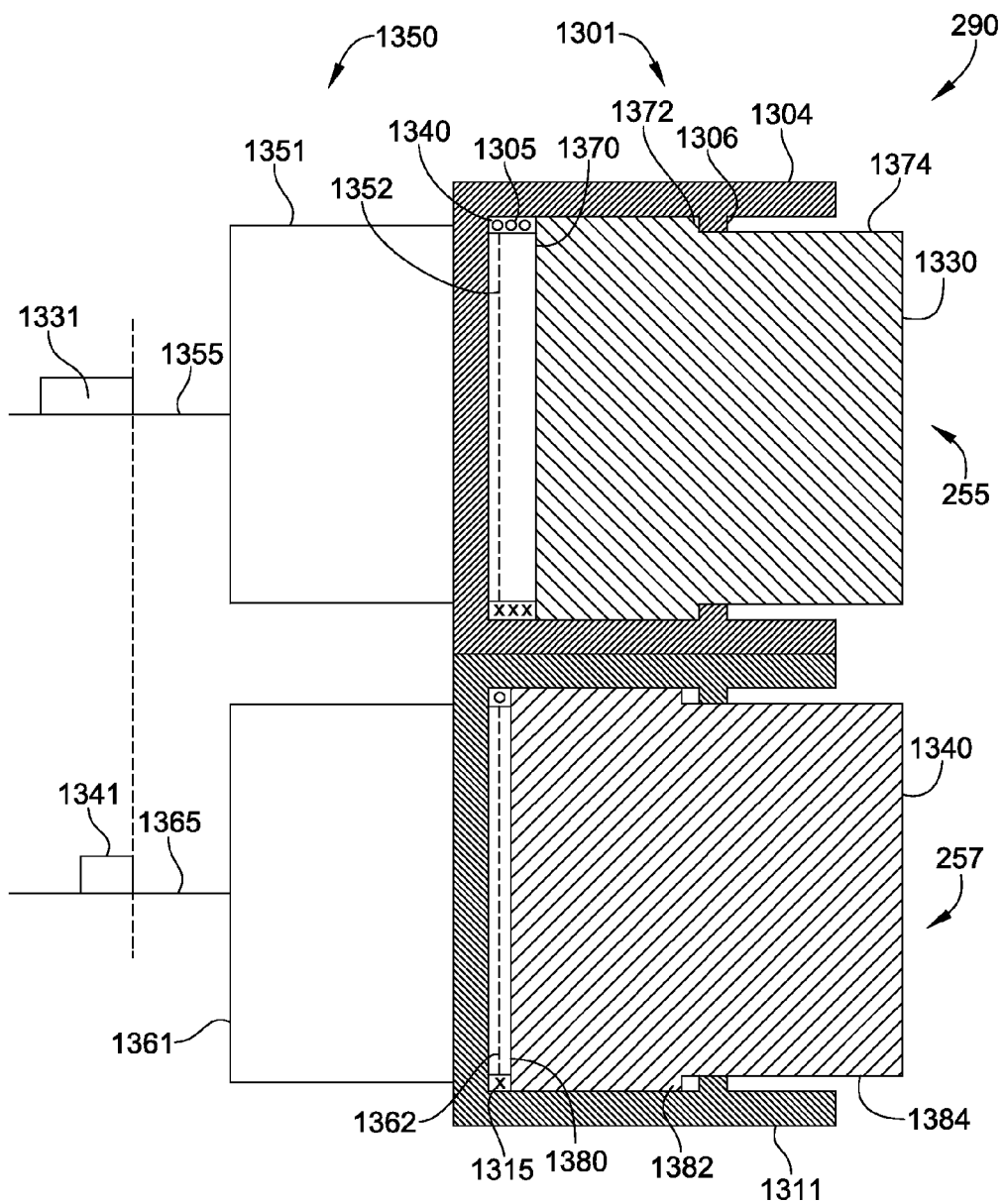
FIG. 19B shows an illustrative embodiment of the trigger device shown in FIG. 19A.

FIG. 19A shows the mobile computing device of FIG. 5 with a trigger device 290 comprising two trigger parts 255, 257 including a first part 1301 and a second part 1350 configuration. With reference to FIG. 19B, the first part 1301 comprises a first housing 1304 and a first trigger 1330, and a second housing 1311 and a second trigger 1340. The first housing 1304 receives first trigger 1330 against a spring 1305. The spring urges first trigger 1330 outwardly against a first flange 1306 defined in the first housing 1304 when in a neutral position. Similarly, the second housing 1311 receives second trigger 1340 against a spring 1315. The spring urges second trigger 1340 outwardly against a first flange 1386 defined in the second housing 131 when in a neutral position.

The second part 1350 comprises a first programmable piezoelectric device 1351 and a second programmable piezoelectric device 1361. The first piezoelectric device 1351 extends through an opening in the first housing 1304 and is held to the first housing by a flange 1350 that sits against an inside surface of the first housing 1304. Similarly, the second piezoelectric device 1361 extends through an opening in the second housing 1311 and is held to the second housing by a flange that sits against an inside surface of the second housing. In the neutral position shown by first trigger 1330, the first trigger is biased away from contacting an inside surface of the first piezoelectric device 1351 by spring 1305. In the position shown by second trigger 1340, the second trigger is in contact with the second piezoelectric device 1361.

In this embodiment, piezoelectric device 1351 has been programmed to generate a first mechanical vibration having a first predetermined vibrational pattern 1331 as shown in FIG. 19B and the second piezoelectric device 1361 has been programmed to generate a second mechanical vibration having a second predetermined vibrational pattern 1341 as shown in FIG. 19B. Hence, a trigger device 290 may be provided with piezoelectric devices, and illustratively programmable piezoelectric devices, to produce the mechanical vibration patterns of this disclosure.

Figure 19C:
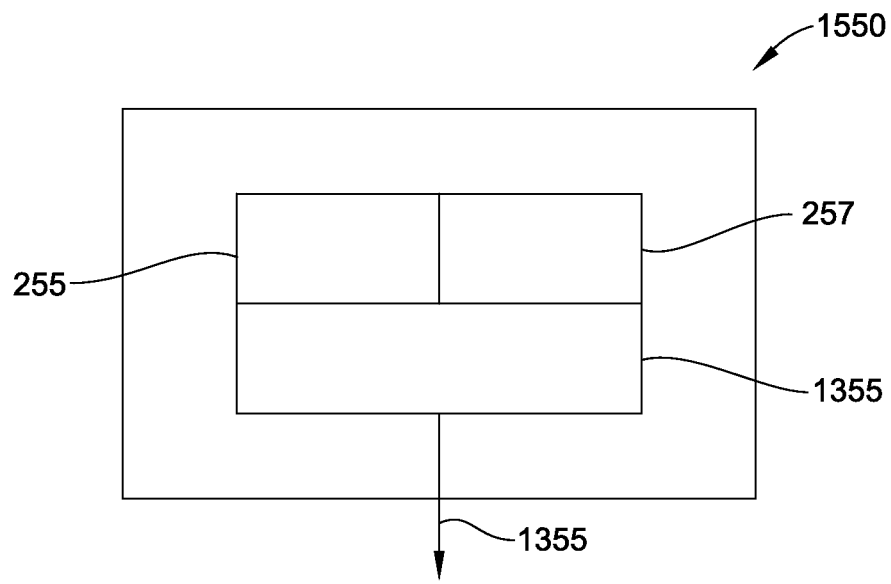
FIG. 19C shows another alternative illustrative embodiment of a trigger device of this disclosure and the analog protocol (vibrational patterns) it creates for communicating data.

FIG. 19C shows another alternative illustrative embodiment of a trigger device 1550 of this disclosure and an analog protocol (vibrational patterns) 1560 it uses for communicating data. Trigger device 1550 comprises two trigger parts 255, 257 and a programmable piezoelectric device 1355. The trigger parts 255, 257 are configured to contact the programmable piezoelectric device 1355 which has been programmed to accept a plurality of streams of data (specifically, the two streams generated by device parts 255, 257, in this example) and combine them into one stream of data that is applied to vibrational signal line 1355. The data on line 1355 is the vibration pattern that travels along the mobile computing device and is picked up by the trigger interface, which modulates the tones or data contained with the vibration pattern into an electrical form that the processor may use for controlling computing functions.

The multiplexing illustratively occurs by time-division multiplexing, or using other techniques, as previously discussed in connection with FIG. 18.

As in the illustrative example shown in FIG. 18, in which the data streams from a plurality of trigger parts are multiplexed, a trigger interface for use in converting the modulated vibration pattern in this example illustratively includes a demultiplexer for demodulating or separating the mixed data streams generated by the trigger device into an electrical pattern (e.g., tonal modulation).

Also as in FIG. 18, the illustrative embodiment of FIG. 19C advantageously creates an analog protocol (vibrational patterns) 1560 that can be used to communicate data. As shown in FIG. 19C, the analog protocol 1560 is illustrated in logic 1's and 0's for each of the device parts 255 and 257; with a logic 1 representative of a vibrational pattern that has been generated by the device part and a logic 0 indicating that the device part has not generated a vibrational pattern (i.e., representative of the absence of a vibrational pattern.) The 1's and 0's in the analog protocol 1560 representative of the modulated vibrational pattern on mechanical vibration line 1355 advantageously provide logic for use in tables for use in decoding the triggers which is illustratively done by the trigger interface in this example.

Again as in the illustrative example of FIG. 18, the trigger device of FIG. 19C is thus configured to create multiple bits (one from each activated trigger) of data all within a single data package useable by the processor. This allows the computer to see data from a plurality of triggers at the same time; thereby allowing for the open-or-closed position of each trigger to define the task that the processor is called upon to perform by the selective activation of one or more of the plurality of triggers. Thus, the analog protocol of this disclosure enables the transmission of complex patterns of data based on the activation or non-activation of a combination of triggers. The activation of one or more of the triggers may occur at the same time or within a predetermined period of time and the open-or-closed states of all the triggers at that point may thus be included in a single data packet. In an alternative embodiment, the sequence in which the triggers are activated may also be used to provide further information to the processor on which functionality the user desires to activate based upon the order of activation of the plurality of triggers that the user has activated. In these and other ways of imparting advanced logic to the activation of a one or more of a plurality of triggers, the analog protocol 1560 adapted by the trigger device of FIG. 19C advantageously provides a table of advanced logic for use in decoding which triggers have been activated by the user. This enables the communication of even more complex data than is possibly from the single bits of data that are generated by one trigger event or a plurality of trigger events, for example, as disclosed in the previous examples.

Referring again to FIG. 2, trigger interface 160 configured to detect and convert the mechanical vibration pattern into an electrical signal pattern is illustratively an accelerometer. Alternatively, trigger interface 160 may be a displacement, a sound pressure level sensor, or any other sensor that is capable of detecting a mechanical vibration pattern and selectively actuating the mobile computing device. In an illustrative embodiment the frequencies of the mechanical vibrations are in the sub-sonic to ultrasonic range. The trigger interface is illustratively selected based on the kind of signal conditioning, the frequency range of the mechanical vibration pattern, and the dynamic range of the sensor required. These criteria for selection of a trigger interface are well known in the art.

The accelerometer or other sensor used for the trigger interface may be provided with hardware for conditioning the electrical signal the accelerometer converts from the trigger device. Such hardware may include hardware for amplification of the electrical signal, filtering, etc. Alternatively, the conditioning circuitry may be built into the accelerometer and be a part of the device interface. Examples of commercially available accelerometers with conditioning circuitry include integrated Electronic Piezoelectric (IEPE) accelerometers.

The first or second processor and associated memory and any signal conditioning hardware may process the electrical pattern generated by the trigger interface using any signal analysis techniques. For example, decoding of the electrical signal pattern generated by the trigger interface may be a decoding technique taken from the group consisting of amplitude and level analysis, frequency (spectral) analysis; noise and distortion analysis; pulse and transition analysis; time domain analysis, tone measurements. The processing of the signal to tonal components may employ any signal processing technique such as digital filtering processing; convolution and correlation processing; frequency domain processing; joint time-frequency analysis signal processing; sampling/resampling processing; signal generation processing; spectral analysis processing; transform processing; time domain processing; and wavelet and filter bank processing.

Referring still to FIG. 2, the processor 110 is configured to actuate a mobile computing function depending on the mechanical vibration pattern generated by the trigger device. For example, the processor may activate a computing function, a scan function, an RFID function, a radio transmission or receipt, such as cellular, WiFi, blue tooth, etc. or some other computing function of the mobile computing device. Other computing function may include retrieving and displaying data, text, images on the display 116 of the mobile computing device.

In FIGS. 17A-17G, mechanical vibration patterns (e.g., 343, 344, and 345 in FIG. 17G) generated by the trigger device are converted into electrical patterns or tonal electrical patterns by the trigger interface. As shown in FIG. 20, each pattern may be associated with a specific computing function in a memory map 1400 stored in the memory unit. For example, a first pattern may be associated with activating a scan function 1402, a second pattern may be associated with activating an RFID function 1404, a third pattern may be associated with the condition of a low battery 1406. Other associations 1408 may be drawn between mechanical vibration patterns, tonal electrical patterns, and specific computing functions. In response to the electrical patterns generated by the trigger interface, the first processor may activate the computing functionality associated with that electrical signal pattern. The processor may indicate on the display unit (e.g., display unit 116 of FIG. 2) the functionality that has been activated by the trigger device. The processor may display data, text, or images in connection with that functionality on the display unit. The processor may display an alert or a notice to the user about the condition or some matter about the mobile computing functionality activated. For example, in the case of a low battery condition, the first processor may display a message on the display unit prompting the user to switch battery.

The association of the electrical patterns generated by the trigger interface and the corresponding computing function may thus be mapped into the memory. More specifically, the memory may be configured to store a table of properties 1400 correlating the mechanical vibration patterns generated by the trigger device with a specific mobile computing function.

Advantageously, the memory may be configured to store a table of properties correlating the electrical signal pattern generated by the trigger interface from the mechanical vibration pattern with a first set of specific mobile computing functions. The first set of specific mobile computing functions may be taken from the group consisting of a scanner function and an RFID function.

In another illustrative embodiment, the table of properties in the memory may include properties correlating electrical signal patterns generated by the trigger interface with a second set of specific mobile computing functions. The second set of mobile computing functions may be electrical signal patterns taken from mechanical vibration patterns generated by other than the trigger device. Thus, the mechanical vibration patterns generated by other than the trigger device such as vibrations from tapping a touch screen on commercially available mobile computing devices are detected by the processor and are dealt with differently.

FIG. 20B shows an alternative memory map of this disclosure illustratively for use with the analog protocol used by the trigger device of FIG. 18. The column titled "Trigger Device Mechanical Vibration Pattern Modulation" contains the logic for the trigger device of FIG. 18 which has been previously discussed in connection with FIG. 18 above. The column titled "Trigger Interface Generated Electrical Signal Pattern (e.g. Tonal Modulation)" represents the electrical analog to the mechanical vibration data contained in a packet of data transmitted by the trigger device. The electrical analog is illustratively generated by the trigger interface discussed in this disclosure. The column titled "Computing Functionality Triggered In Mobile Computing Device" represents the computing functionality that the processor activates in response to the modulated mechanical vibration which has been decoded by the trigger interface in this example. From FIG. 20B can be seen the advanced logic that may be imparted to the mobile computing device using the analog protocol employed by the trigger device of FIG. 18. In particular, the memory map 1570 of FIG. 20B is configured to store a table of properties correlating the mechanical vibration pattern generated by the trigger device to a specific mobile computing function. For example, a mechanical vibration pattern of "0 0 0" contained in a packet of data transmitted by the trigger device is tonally modulated to represent an electrical logic signal of "0 0 0"

which the memory map associates with the state of there being no computing function required by the user. For a mechanical vibration pattern of "0 0 1" contained in a packet of data transmitted by the trigger device and tonally modulated to represent an electrical logic signal of "0 0 1" illustratively by the trigger interface, the memory map associates this with the state of scanning functionality that the user is calling by the activation of the trigger device in this way. In other words, the processor will execute a scanning function when it detects a logic 001 from the trigger interface in this example (i.e., when a user has activated only switch 1516.) Other examples in FIG. 20B that show the association of computing functionality with a mechanical vibration pattern illustrate the advanced form of logic that may be used to activate computing functions in mobile computing device. Not only does the logic made possible by this disclosure enable the disclosed trigger to active different functions individually— such as the scan only or the RFID only function. But the disclosed logic also enables a plurality of functions to be activated at the same time—such as scan and WIFI and WAN functionality—all in response to a mechanical vibration pattern representative of logic 1 1 0 in accordance with this disclosure.

FIG. 20C shows an alternative memory map of this disclosure illustratively for use with the analog protocol used by the trigger device of FIG. 19C. The columns and titles are the same as shown in FIG. 19B except that the column titled "Trigger Device Mechanical Vibration Pattern Modulation" contains the logic for the trigger device of FIG. 19C which has been previously discussed in connection with FIG. 19C above. The column titled "Trigger Interface Generated Electrical Signal Pattern (e.g. Tonal Modulation) represents the electrical analog to the mechanical vibration data contained in a packet of data transmitted by the trigger device. The electrical analog is illustratively generated by the trigger interface discussed in this disclosure. The column titled "Computing Functionality Triggered In Mobile Computing Device" represents the computing functionality that the processor activates in response to the modulated mechanical vibration which has been decoded by the trigger interface in this example. As in FIG. 20B, from FIG. 20C can be seen the advanced logic that may be imparted to the mobile computing device using the analog protocol employed by the trigger device of FIG. 19C. In particular, the memory map 1580 of FIG. 20C is configured to store a table of properties correlating the mechanical vibration pattern generated by the trigger device to a specific mobile computing function. For example, a mechanical vibration pattern of "0 0" contained in a packet of data transmitted by the trigger device is tonally modulated to represent a electronic logic signal "1 1" which the memory map associates with the state of there being no computing function required by the user. In FIG. 20B, the logic of the tonal modulation illustratively generated by the trigger interface was illustrated to have a logic pattern that is identical to the logic pattern used to represent the mechanical vibration pattern. For example mechanical vibration pattern logic 1 1 1 correlates to tonal modulation logic 1 1 1 in the FIG. 20B example. In FIG. 20C, the logic pattern employed by the trigger interface is different from the logic pattern used by the trigger interface. For example, a mechanical vibration pattern of "0 0" contained in a packet of data transmitted by the trigger device is tonally modulated, illustratively by the trigger interface, to represent a logic "1 1"; a pattern that is inverted from the mechanical vibration pattern, but that maintains a logical association of the mechanical vibration to the computing function to be activated, as shown in the logic map 1580. FIG. 20C also illustrates that the computing functionality to bee triggered in the mobile computing device can be any function, including, the level of charge of a battery that may be displayed on a display of the mobile computing device by a processor in response to the mechanical vibration patterns generated by the trigger device.

Figure 21:
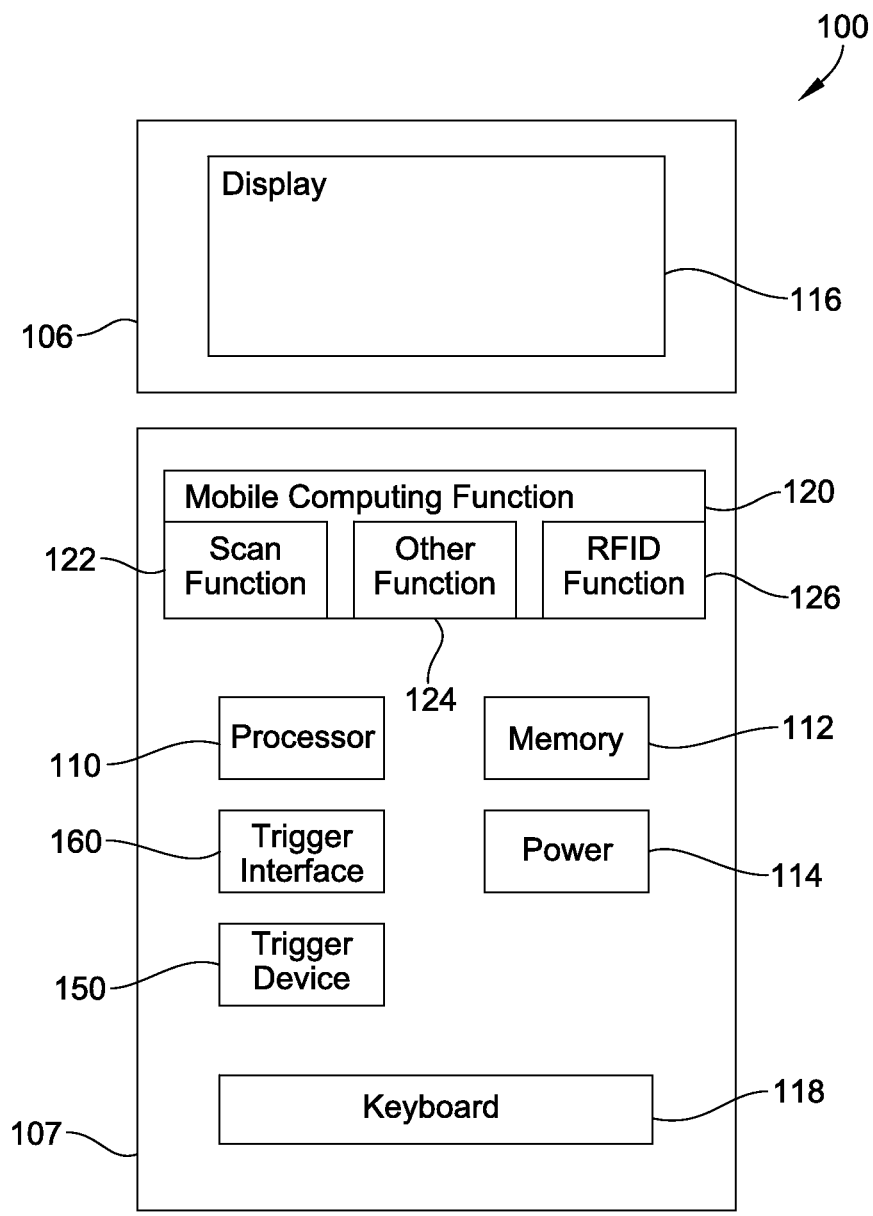
FIG. 21 shows the functional components of FIG. 2 arranged in a mobile computing device in the form factor of a clam shell having a display part and a keyboard part.
Figure 22:
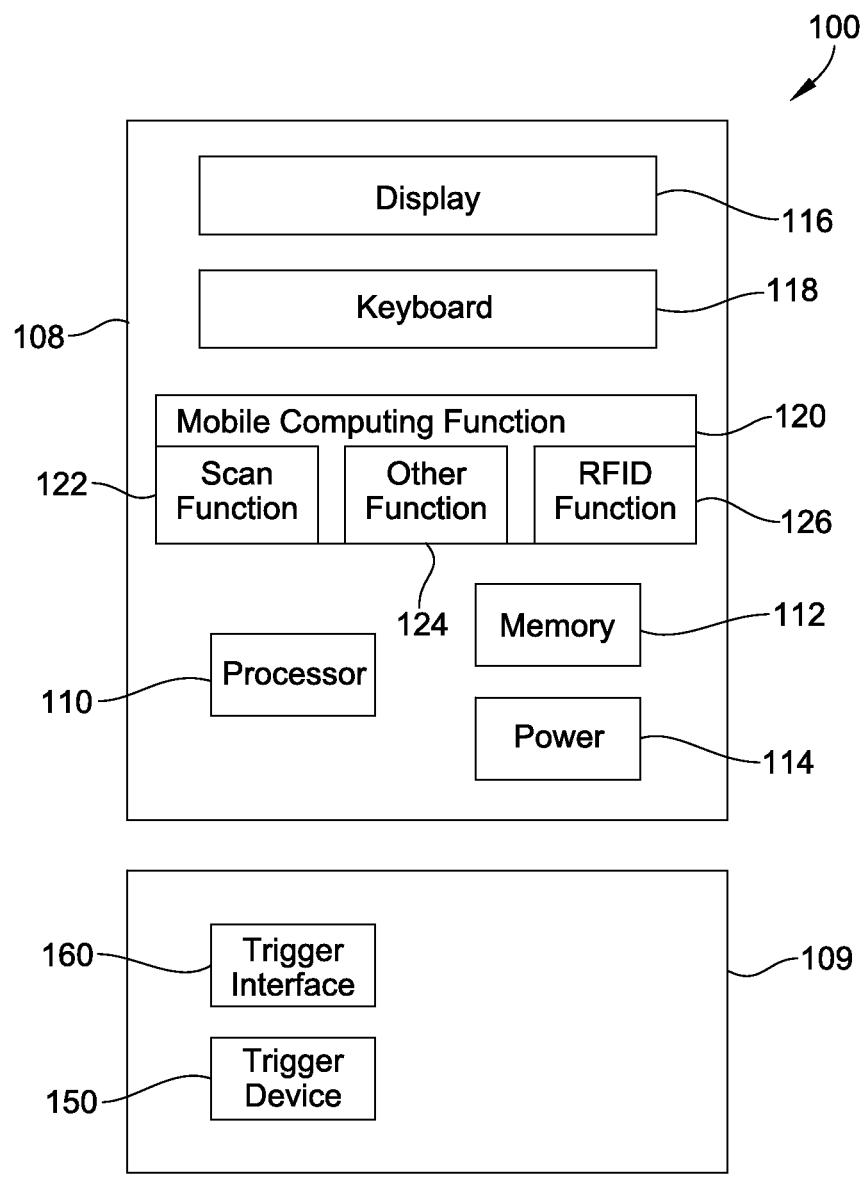
FIG. 22 shows the functional components of FIG. 2 arranged in the form factor of an industrial mobile computing device comprising a mobile computing terminal and a handle.

In FIG. 2, the functional components making up a mobile computing device 100 are shown residing in a mobile computing device in the form factor of a candy bar. FIGS. 21 and 22 show alternative form factors that may be taken by the mobile computing device of this disclosure. FIG. 21 shows the functional components of FIG. 2 arranged in a mobile computing device in the form factor of a clam shell having a display part 106 and a keyboard part 107. Illustratively, all of the elements described in FIG. 2 reside in the keyboard part 107 of the clam shell of FIG. 21 although the arrangement of the parts between the display part and keyboard parts of the claim shell is a matter of design choice and within the scope of this disclosure.

FIG. 22 shows the functional components of FIG. 2 arranged in the form factor of an industrial mobile computing device comprising a mobile computing terminal 108 and a handle 109. Illustratively, the handle 109 includes the trigger device 150 and the trigger interface 160 and the mobile computing terminal 108 includes the other functional components identified in FIGS. 1 and 2. As previously described, the trigger interface may alternatively be located in the mobile terminal; the scan handle in that case providing a conduit for the travel of the mechanical vibrations to the mobile terminal as previously described.

The components shown in FIGS. 21 and 22 are the same components as shown and described in FIG. 2 except that the functional component mobile computing function 120 is shown comprising a scan function 122, an RFID function 126, and another function 124 described below. The scan function and RFID functions that may be used in mobile computing device 100 are well known in the art. The other function 124 may include other functions such as one or more radios configured for transmitting, receiving blue tooth, WiFi, or other communications.

In the form factor illustrated in FIG. 22, the mobile computer terminal and the handle may be attached to each other in an integrated device as shown in FIG. 1. Alternatively, the handle may be an accessory which may be removed from a mobile computing terminal and used again with the same mobile computing terminal or a different mobile computing terminal; thereby expanding the scope of the use of the handle with the mobile computing terminal.

Figure 23A:
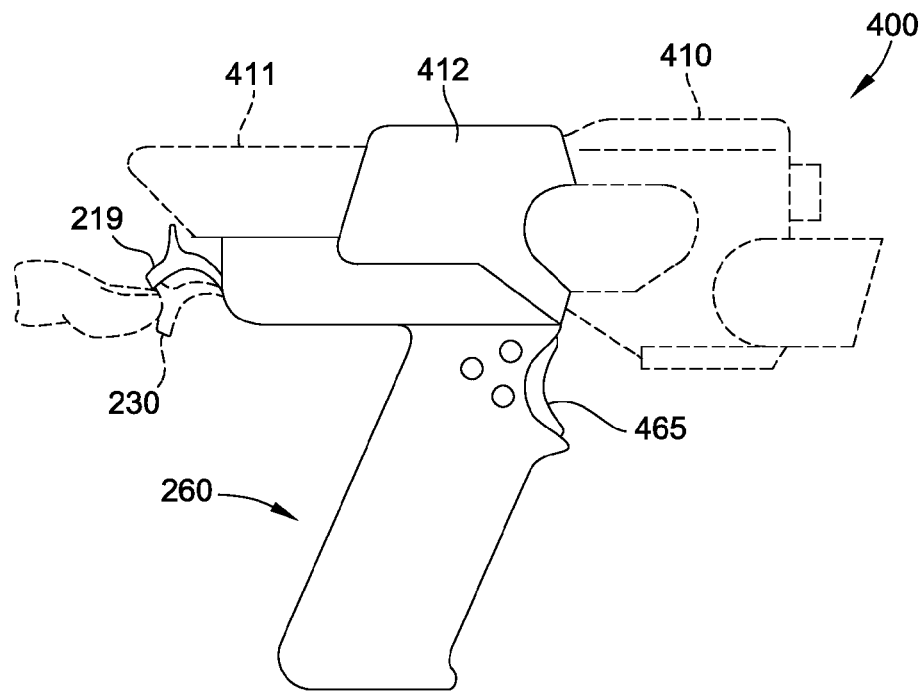
FIGS. 23A-23E show an industrial mobile computing device including a mobile computing terminal part and a removable handle part.
Figure 23B:
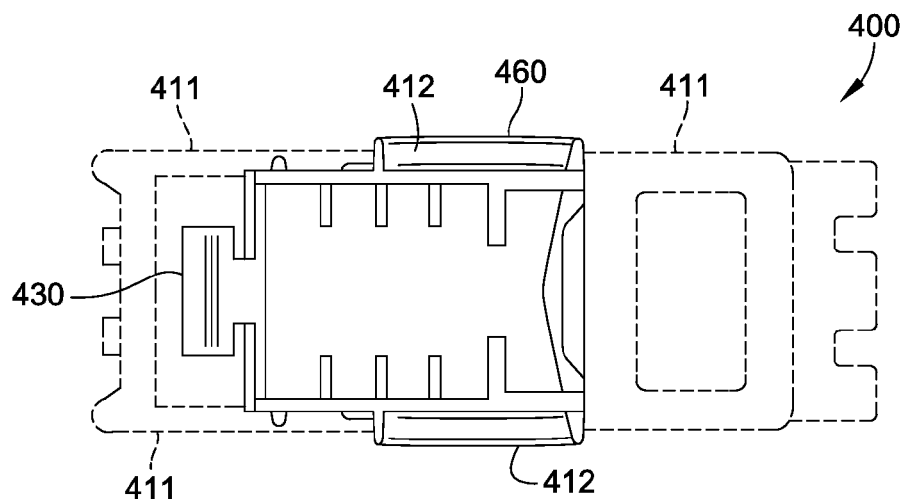
Figure 23C:
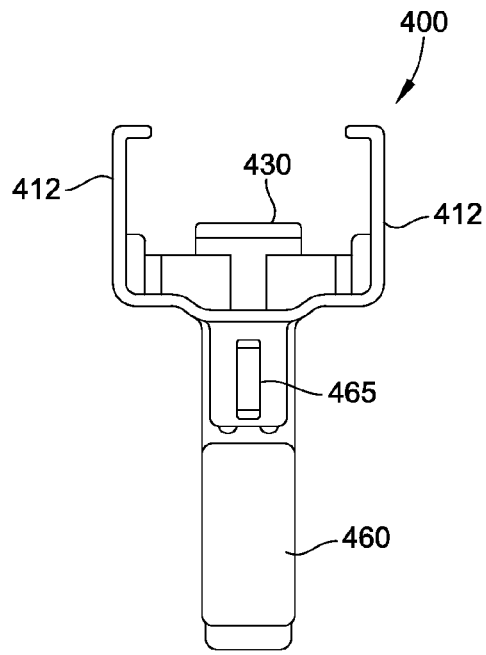
Figure 23D:
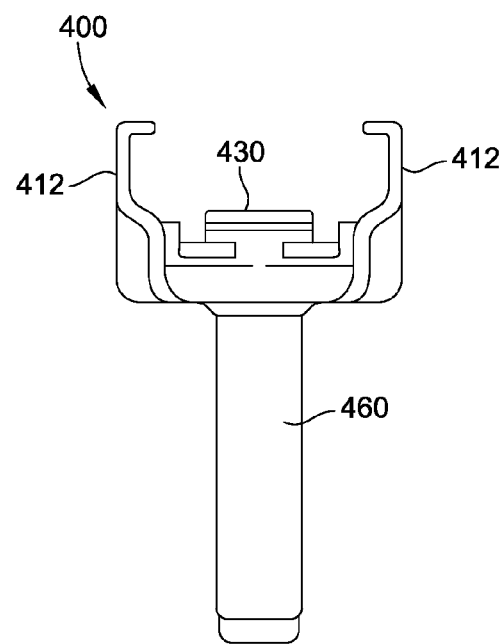
Figure 23E:
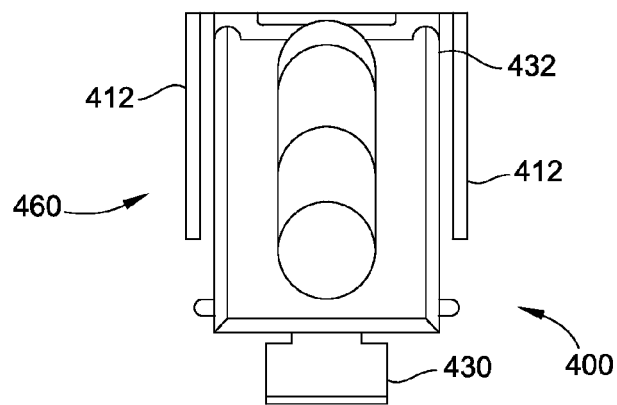

FIGS. 23A-E are illustrative examples of an industrial scanning device 400 showing a handle 460 which is removable. As shown in FIG. 23A, the industrial scanner 400 typically has an integrated computer terminal 411 with scanner and display 410. FIG. 23B shows integrated computer terminal 411, which is illustrated in dashed lines, attached to a handle 460. As shown in FIGS. 23C and 23D, the handle 460 has sides 412 which extend around the sides of the computer terminal 410 as well as partially extending over the top of the computer terminal 410. Each of the sides 412 includes a flange which extends inwardly toward the opposite side. The sides 412 create a groove into which the computer terminal 410 can be slid. The computer terminal is held in place using a manually operated catch 430 shown in FIG. 23E as well as in the other FIGS. When the computer terminal 410 is slid backwards into groove 432 shown in FIG. 23E, the catch 430 secures the terminal 410 in place with respect to the handle 460. To remove the terminal 410 from the handle 460, the user simply presses down on the catch 430 and slides out the terminal 410. The catch 430 can be constructed of a resilient material which is sufficiently rigid to hold the terminal 410 in place during use and flexible enough to allow easy removal of the terminal 410 from the handle 460. The handle 460 also contains a trigger 465 used to activate the computer terminal 410. The trigger 465 activates the trigger interface (not shown) which may be located within handle 460 or the mobile computing terminal 410 according to this disclosure. The trigger interface activates the scanner, and in this way, the need for a mechanical or magnetic scanner activating system normally used to activate a scanner is obviated.

Advantageously, in the above illustrative example where the terminal device part includes a case and the handle part includes a case; the vibration pattern generated by the trigger device travels along the case of the handle part to the case of the terminal device part.

The form factors taken by the mobile computing device 100 in the FIGS. are illustrative only. It will be appreciated that the elements shown in the FIGS. may be arranged in any form factor; all of which are within the scope of this invention.

Figure 24:
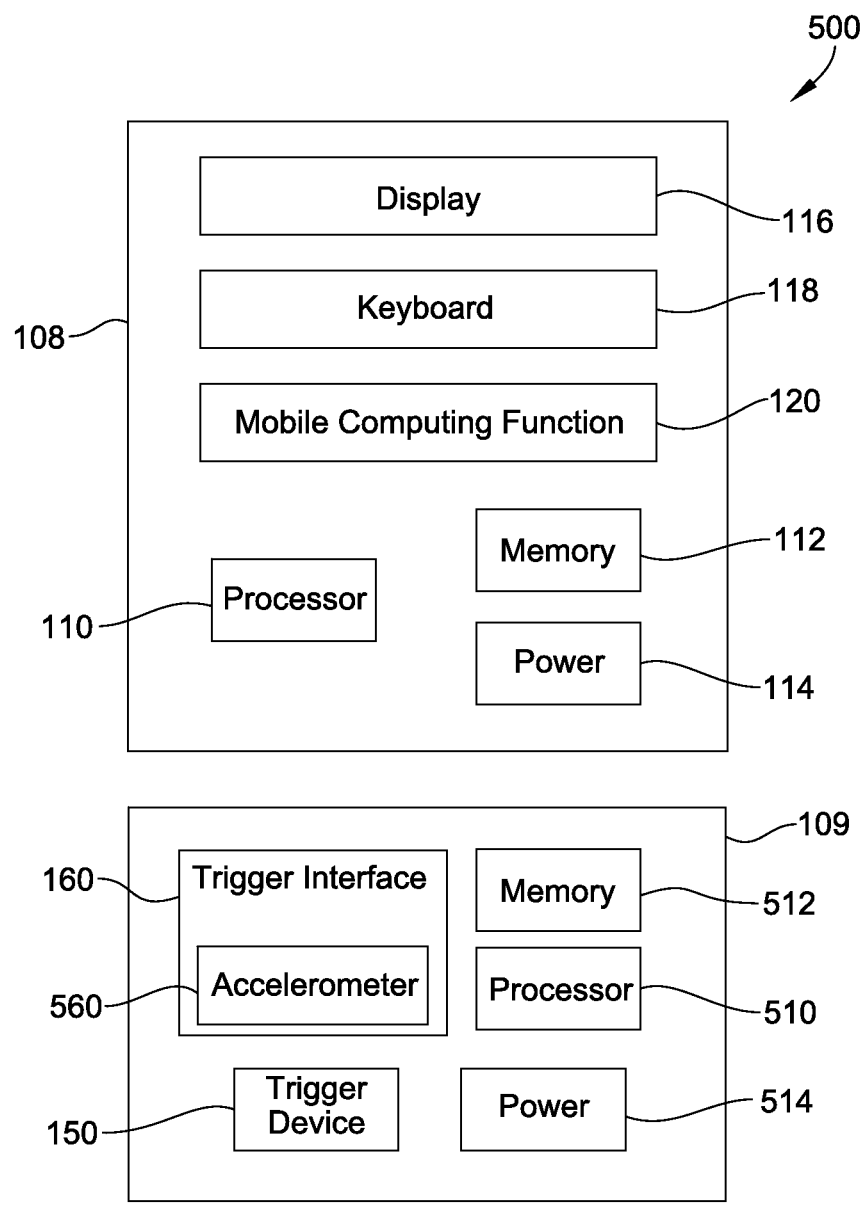
FIGS. 24 and 25 show further embodiments of an industrial grade mobile computing device according to this disclosure.
Figure 25:
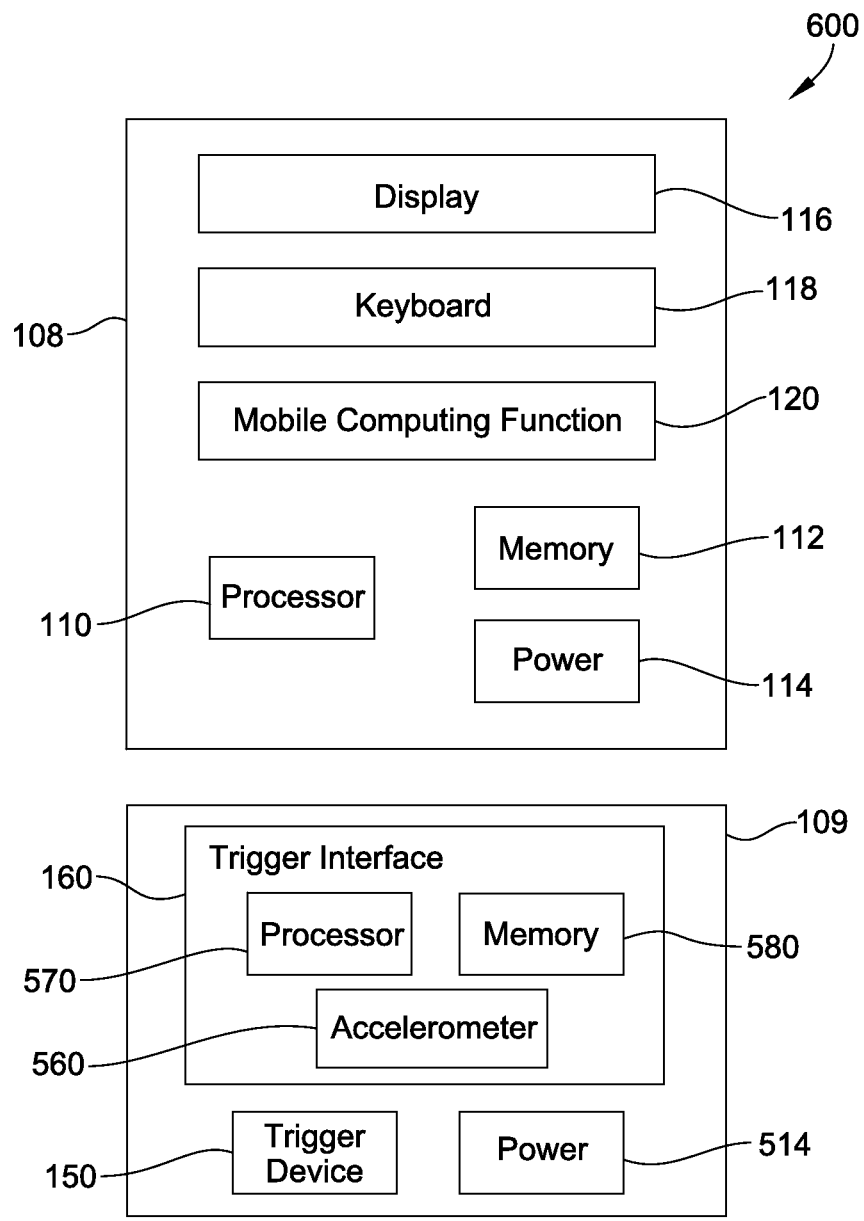

FIGS. 24 and 25 illustrate an industrial grade mobile computing device 500, 600, respectively in the form factor shown in FIG. 22 and including the functional components of FIG. 2 Mobile computing devices 500, 600 of FIGS. 24 and 25, respectively, comprise a mobile computing terminal 108 and a handle 109. Illustratively, the handle 109 includes the trigger device 150 and the trigger interface 160 and the mobile computing terminal 108 includes the other functional components identified in FIGS. 1 and 2. The description of these components bearing like numbering to those shown in FIG. 22 is applicable to discussion of those components in FIGS. 24 and 25. In FIG. 24, the handle 109 of the mobile computing device 500 of FIG. 23 includes an accelerometer 560 and the handle further includes a second processor 510, a memory unit 512, and a power source 514. The accelerometer 560 is included in the trigger interface 160 in this example. Second processor 510 can be any microprocessor capable of accessing information stored in memory unit 512, performing actions based on instructions using information from memory unit 512 or some other source, and alternatively storing information in memory unit 512 or transmitting information. The processor may be a stand-alone processor or a digital signal processor specific to the trigger interface application. The processor may provide processing functionality for the trigger interface additional to the processing provided by processor 110. Memory unit 512 provides memory for use by processor 510 and power 514 provides the electrical components in the handle with a source of power independent from or in conjunction with power source 114 in the mobile computing device. The memory may include the mapping of the electrical patterns generated by the trigger interface to the computing functions associated with those patterns as previously disclosed in connection with memory unit 112 above.

In FIG. 25, the handle 109 of the mobile computing device 500 of FIG. 22 includes an accelerometer 560 and the handle further includes a second processor 510, a memory unit 512, and a power source 514. These components may operate in the same or similar fashion as they operate in FIG. 22 except that the processor 570, memory 580 and the accelerometer 560 are all included in the trigger interface 160 in this example. In the foregoing description of FIGS. 24 and 25, the second processor may be configured to decode mechanical vibration patterns into mechanical vibration components.

Figure 26:
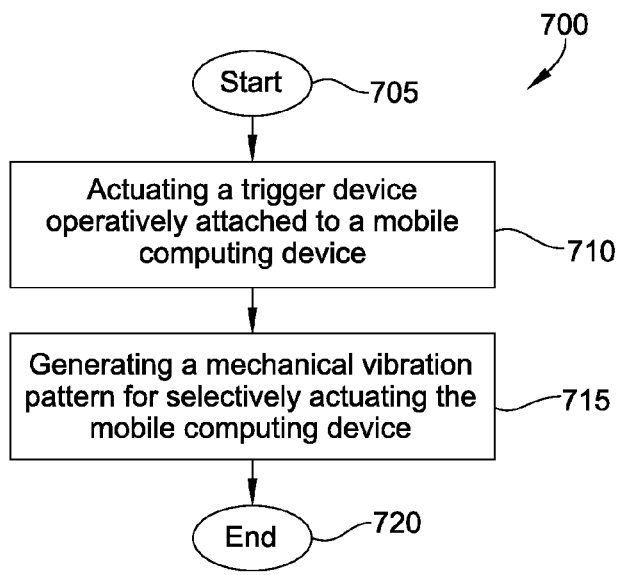
FIGS. 26 and 27 show illustrative methods for actuating a mobile computing functionality in a mobile computing device based on mechanical vibration patterns generated by a trigger device according to this disclosure.

In a method of this disclosure shown in FIG. 26, a process 700 for actuating a mobile computing functionality in a mobile computing device starts at step 705. At step 710, a trigger device operatively attached to a mobile computing device is activated. At step 715, a mechanical vibration pattern for selectively actuating the mobile computing device is generated.

Figure 27:
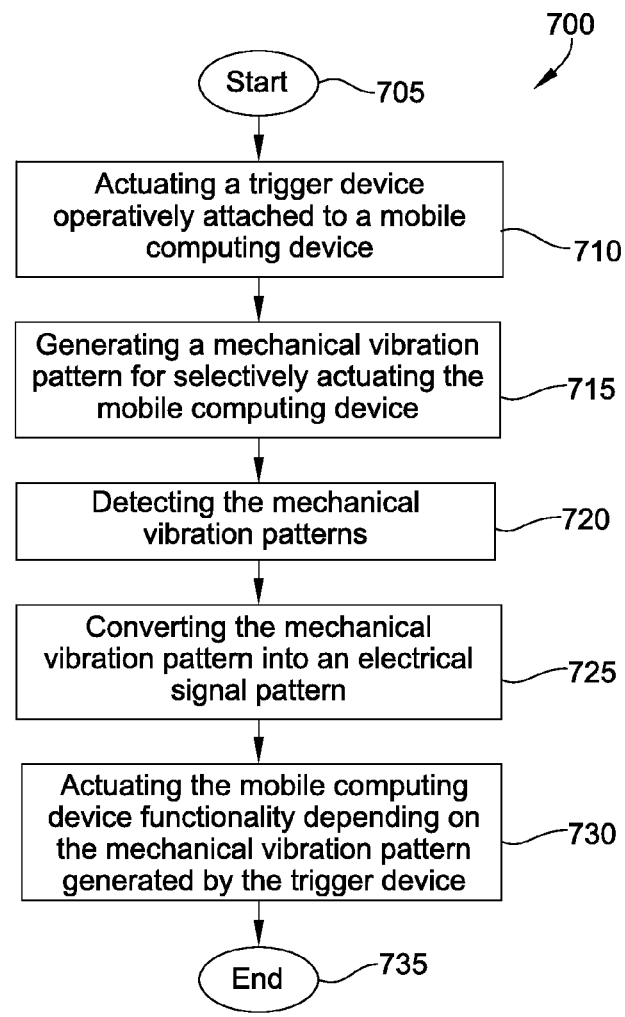

In a further method of this disclosure illustrated in FIG. 27, a process 700 begins with steps 705, 710, and 715 as previously described. At step 720, the mechanical vibration is detected. At step 725, the mechanical vibration pattern is converted into an electrical signal pattern. At step 730, functionality in the mobile computing device is actuated depending upon the mechanical vibration pattern generated by the trigger device. The process ends at step 735 in this illustrative method.

In another illustrative embodiment, the method includes the step of decoding the mechanical vibration pattern into mechanical vibration components. In another illustrative embodiment, the method includes the further step of correlating the detected electrical signal pattern with a specific mobile computing function. One illustrative memory mapping is discussed above in connection with FIG. 20 in this regard. The specific mobile computing function of the method may be a first set of specific mobile computing functions taken from the group consisting of a scanner function and an RFID function. The specific mobile computing function may also a second set of specific mobile computing functions generated by other than the trigger device. In one illustrative embodiment, the second set of specific mobile computing function includes tapping a touch screen.

In another illustrative embodiment, the trigger device is operatively attached to a handle part connected to a terminal device part of the mobile computing device. In another embodiment, the method further includes the step of displaying a message on a display unit of the mobile computing device based on the mechanical vibration pattern detected.

In one illustrative embodiment of the method, the step of decoding the mechanical vibration pattern into mechanical vibration components involves a decoding technique taken from the group consisting of amplitude and level analysis, frequency (spectral) analysis; noise and distortion analysis; pulse and transition analysis; time domain analysis, tone measurements.

In another illustrative embodiment of the method, the step of decoding the mechanical vibration pattern into mechanical vibration components involves a processing taken from the group consisting of signal processing; digital filtering processing; convolution and correlation processing; frequency domain processing; joint time-frequency analysis signal processing; sampling/resampling processing; signal generation processing; spectral analysis processing; transform processing; time domain processing; and wavelet and filter bank processing.

Many mobile computing devices are provided with an accelerometer configured to detect the orientation of the device as well as device movements and vibrations. The use of that accelerometer as the trigger interface of this disclosure provides further quality, efficiency, reliability, safety, ergonomics, and cost effectiveness according this disclosure.

The foregoing disclosure allows for mechanical vibration patterns generated by a trigger device to activate computing functions. The activation of these functions by the trigger device of this disclosure may be less expensive than activation of these functions using for example, blue tooth or radio, which require expensive components and have considerable power demands. The generation of vibrations as provided in this disclosure is inexpensive then these conventional methods. Further, and as previously indicated, many conventional consumer mobile computing devices are already provided with an accelerometer. This disclosure enables the configuration of that accelerometer to provide the trigger interface of this disclosure. Hence, this disclosure may be easily implemented in many current solutions.

Another limitation on some conventional trigger devices is the power they require to operate. For example, trigger devices employing wireless communication place demands on the power sources that are available in the mobile computing devices. The trigger device of this disclosure has low power requirements in comparison. In addition, the trigger device of this disclosure may have a longer shelf life than conventional triggers since they may require less force to activate and may have lower power requirements.

It will be appreciated that any measurement techniques may be used with this disclosure to decode information in the mechanical vibration pattern that a trigger device has been designed to deliver. For example, the decoding may be performed using amplitude and level analysis, frequency (spectral) analysis; noise and distortion analysis; pulse and transition analysis; time domain analysis, tone measurements, and other measurement techniques.

The processing in the trigger interface may also include the processing techniques taken from the group consisting of signal processing; digital filtering processing; convolution and correlation processing; frequency domain processing; joint time-frequency analysis signal processing; sampling/resampling processing; signal generation processing; spectral analysis processing; transform processing; time domain processing; and wavelet and filter bank processing.

This disclosure provides improved quality, efficiency, reliability, safety, ergonomics, and cost effectiveness over conventional mobile computing devices. This disclosure allows mobile computing devices to serve the high demand for mobile computing devices better; broadening their application so as to make them better useable anywhere, anytime. It will be apparent to those skilled in the art that various modifications and variations can be made to the disclosed system and method. Other embodiments will be apparent to those skilled in the art from the consideration of the specification and practice of the disclosed system and method. It is intended that the specification and examples be considered as exemplary only, with a true scope being indicated by the following claims and their equivalents.

What is claimed is:

1. A mobile computing device comprising;
a first processor;
a trigger device operatively attached to the mobile computing device configured to generate a mechanical vibration pattern for selectively actuating the mobile computing device;
a trigger interface configured to detect and convert the mechanical vibration pattern into an electrical signal pattern;
wherein the first processor is configured to actuate a mobile computing function depending on the mechanical vibration pattern generated by the trigger device in response to the electrical signal pattern.

2. The mobile computing device of claim 1:
wherein the trigger interface comprises an accelerometer device.

3. The mobile computing device of claim 1 further comprising:
a memory configured to store a table of properties correlating the mechanical vibration pattern generated by the trigger device with a specific mobile computing function.

4. The mobile computing device of claim 3:
wherein the specific mobile computing function is taken from the group consisting of a scanner function and an RFID function.

5. The mobile computing device of claim 1:
wherein the mobile computing device is a mobile computing device taken from the group consisting of a handheld terminal, a lap top computer, a smart phone, a handheld personal digital assistant (PDA), a wireless mobile phone, a pager, and an industrial grade mobile computer with scanning and/or RFID functionality.

6. The mobile computing device of claim 5:
wherein a process for decoding the mechanical vibration pattern is taken from the group consisting of amplitude and level analysis, frequency (spectral) analysis; noise and distortion analysis; pulse and transition analysis; time domain analysis, and tone measurements.

7. The mobile computing device of claim 6:
wherein a process for decoding the mechanical vibration pattern is taken from the group consisting of signal processing; digital filtering processing; convolution and correlation processing; frequency domain processing; joint time-frequency analysis signal processing; sampling/resampling processing; signal generation processing; spectral analysis processing; transform processing; time domain processing; and wavelet and filter bank processing.

8. The mobile computing device of claim 1:
wherein the trigger device includes a plurality of trigger parts; and
wherein the mechanical vibration pattern generated by the trigger device includes multiple bits of data generated by the plurality of trigger parts.

9. A mobile computing device comprising;
a terminal device part including a first processor;
a handle part connected to the terminal device part, the handle part including a trigger device operatively attached to the handle part and configured to generate a mechanical vibration pattern for selectively actuating the mobile computing device; and
wherein the first processor is configured to actuate a mobile computing function depending on the mechanical vibration pattern generated by the trigger device.

10. The mobile computing device of claim 9:
further comprising a trigger interface configured to detect and convert the mechanical vibration pattern into an electrical signal pattern; and
wherein the first processor is configured to actuate a mobile computing function depending on the mechanical vibration pattern generated by the trigger device in response to the electrical signal pattern.

11. The mobile computing device of claim 10:
wherein the handle part is removable from the terminal part of the mobile computing device.

12. The mobile computing device of claim 11:
wherein the terminal device part includes a case;
wherein the handle part includes a case; and
wherein the vibration pattern generated by the trigger device travels along the case of the handle part to the case of the terminal device part.

13. The mobile computing device of claim 12:
wherein the trigger interface further comprises an accelerometer device included in the handle part of the mobile computing device, and
wherein the handle part of the mobile computing device includes a second processor configured to decode the mechanical vibration pattern.

14. The mobile computing device of claim 13 further comprising:
- a memory configured to store a table of properties correlating the electrical signal pattern detected by the signal interface with a specific mobile computing function.

15. The mobile computing device of claim 14:
- wherein the table of properties in the memory includes properties correlating electrical signal patterns generated by the trigger interface in response to the mechanical vibration generated by the trigger device with a first set of specific mobile computing functions.

16. The mobile computing device of claim 15:
- wherein the first set of specific mobile computing functions is taken from the group consisting of a scanner function, an RFID function, and a power source function.

17. The mobile computing device of claim 15:
- wherein the first set of specific mobile computing functions includes a function taken from the group consisting of the number of activations of the trigger device and the speed of activation of the trigger device.

18. The mobile computing device of claim 15:
- Wherein the trigger device includes a plurality of trigger parts; and
- wherein the mechanical vibration pattern generated by the trigger device includes multiple bits of data generated by the plurality of trigger parts.

19. The mobile computing device of claim 16:
- wherein the terminal part further comprises a display unit configured to display a message based on the mechanical vibration pattern generated by the trigger device.

20. A method of actuating a mobile computing functionality in a mobile computing device, the method comprising the steps of:
- activating a trigger device operatively attached to a mobile computing device;
- generating a mechanical vibration pattern for selectively actuating the mobile computing device;
- detecting the mechanical vibration pattern;
- converting the mechanical vibration pattern into an electrical signal pattern; and
- actuating the mobile computing device depending on the mechanical vibration pattern generated by the trigger device.

* * * * *